(12) United States Patent
Takaki et al.

(10) Patent No.: US 12,672,503 B2
(45) Date of Patent: \*Jun. 30, 2026

(54) DEVELOPING APPARATUS

(71) Applicant: Tokyo Electron Limited, Tokyo (JP)

(72) Inventors: Shinsuke Takaki, Kumamoto (JP); Hiroki Tadatomo, Tokyo (JP); Yoji Sakata, Kumamoto (JP); Tomoya Onitsuka, Kumamoto (JP); Naoki Shibata, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 19/072,095

(22) Filed: Mar. 6, 2025

(65) Prior Publication Data

US 2025/0201586 A1     Jun. 19, 2025

Related U.S. Application Data

(63) Continuation of application No. 18/640,443, filed on Apr. 19, 2024.

(30) Foreign Application Priority Data

Apr. 20, 2023    (JP) ................................. 2023-069315
Jan. 23, 2024    (JP) ................................. 2024-008249

(51) Int. Cl.
H10P 72/00          (2026.01)
G03F 7/00          (2006.01)
          (Continued)
(52) U.S. Cl.
CPC ........ H10P 72/0402 (2026.01); G03F 7/0042 (2013.01); G03F 7/30 (2013.01);
          (Continued)

(58) Field of Classification Search
None
See application file for complete search history.

(56) References Cited

U.S. PATENT DOCUMENTS

2005/0111935 A1*  5/2005  Kim .................. H01L 21/67772
                                                                414/217
2010/0195066 A1*  8/2010  Kim ..................... G03F 7/7075
                                                                355/27
          (Continued)

FOREIGN PATENT DOCUMENTS

JP        2020-119961 A      8/2020

*Primary Examiner* — Rodney E Fuller
(74) *Attorney, Agent, or Firm* — Nath, Goldberg & Meyer; Jerald L. Meyer; Tanya E. Harkins

(57)          ABSTRACT

A substrate processing system provided with a plurality of apparatuses to perform a patterning on a plurality of the substrates, wherein a transfer container accommodating the plurality of substrates is transferred to the plurality of apparatuses in a sequential manner. The substrate processing system includes: a first apparatus of the plurality of apparatuses, which is configured to form a metal-containing resist film on each substrate; a second apparatus of the plurality of apparatuses, which is configured to perform a development on the metal-containing resist film after exposure; and an atmosphere regulator having an accommodation space where the substrates, on each of which the metal-containing resist film before being subjected to the development is formed, are accommodated and configured to regulate an atmosphere of the accommodation space so as to regulate a degree of progress of a reaction of the metal-containing resist film on each substrate.

9 Claims, 17 Drawing Sheets

(51) Int. Cl.
   *G03F 7/004*      (2006.01)
   *G03F 7/30*       (2006.01)
   *G03F 7/36*       (2006.01)
   *G03F 7/38*       (2006.01)
   *H10P 72/30*     (2026.01)

(52) U.S. Cl.
   CPC .................. *G03F 7/36* (2013.01); *G03F 7/38*
      (2013.01); *G03F 7/70716* (2013.01); *G03F*
      *7/7075* (2013.01); *G03F 7/70866* (2013.01);
         *G03F 7/70933* (2013.01); *G03F 7/70991*
      (2013.01); *H10P 72/0474* (2026.01); *H10P*
      *72/3404* (2026.01); *H10P 72/3411* (2026.01)

(56) References Cited

U.S. PATENT DOCUMENTS

| | | | |
|---|---|---|---|
| 2011/0086313 A1* | 4/2011 | Oori | H01L 21/0274 |
| | | | 430/312 |
| 2015/0380288 A1* | 12/2015 | Hirano | C23C 16/54 |
| | | | 438/597 |
| 2017/0221743 A1* | 8/2017 | Kondoh | H01L 21/67389 |
| 2020/0020555 A1* | 1/2020 | Kim | H01L 21/67736 |
| 2021/0035830 A1* | 2/2021 | Kim | H01L 21/67161 |
| 2024/0160118 A1* | 5/2024 | Park | H01L 21/67109 |
| 2024/0355644 A1* | 10/2024 | Takaki | G03F 7/70866 |

* cited by examiner

FIG. 6

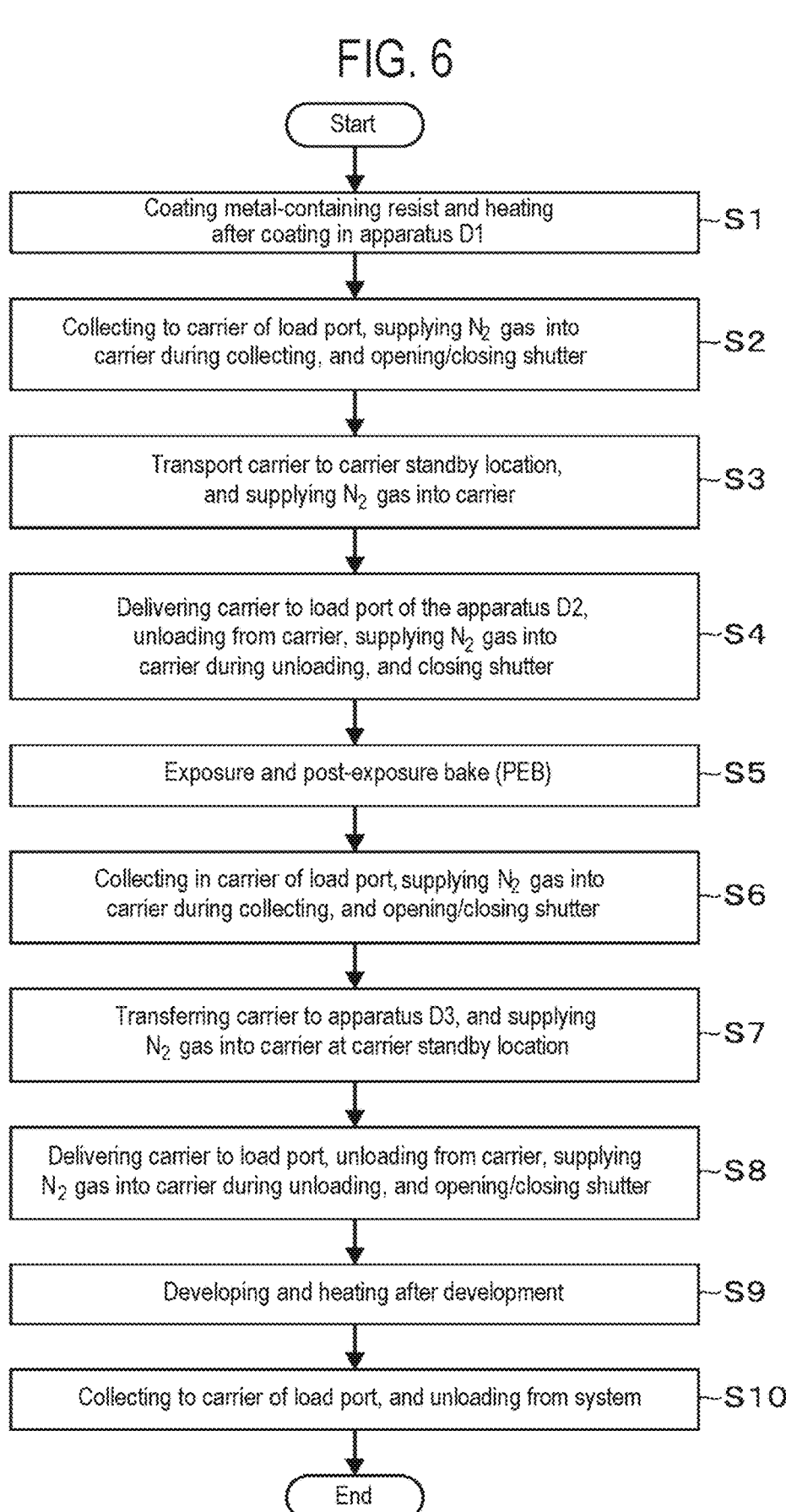

Start

S1 — Coating metal-containing resist and heating after coating in apparatus D1

S2 — Collecting to carrier of load port, supplying N₂ gas into carrier during collecting, and opening/closing shutter S3 — Transport carrier to carrier standby location, and supplying N₂ gas into carrier S4 — Delivering carrier to load port of the apparatus D2, unloading from carrier, supplying N₂ gas into carrier during unloading, and closing shutter S5 — Exposure and post-exposure bake (PEB)

S6 — Collecting in carrier of load port, supplying N₂ gas into carrier during collecting, and opening/closing shutter S7 — Transferring carrier to apparatus D3, and supplying N₂ gas into carrier at carrier standby location S8 — Delivering carrier to load port, unloading from carrier, supplying N₂ gas into carrier during unloading, and opening/closing shutter S9 — Developing and heating after development S10 — Collecting to carrier of load port, and unloading from system End

Y
|
Z⊙—→X

DEVELOPING APPARATUS

CROSS-REFERENCE TO RELATED APPLICATIONS

This is a Continuation Application of U.S. patent application Ser. No. 18/640,443, filed Apr. 19, 2024, an application claiming the benefit from Japanese Application No. 2023-069315, filed Apr. 20, 2023, and from Japanese Application No. 2024-008249, filed Jan. 23, 2024, the contents of each of which are hereby incorporated by reference in their entirety.

TECHNICAL FIELD

The present disclosure relates to a substrate processing system, a substrate processing apparatus, and a substrate processing method.

BACKGROUND

In manufacturing semiconductor devices, photolithography is performed on a semiconductor wafer (hereinafter, referred to as a "wafer"). As a resist used in this photolithography, a metal-containing resist is sometimes used. Patent Document 1 discloses an apparatus for forming a resist film with the resist and developing the resist film after exposure. This apparatus is known to include a substrate accommodation unit in which a plurality of wafers after the formation of the resist film and before exposure are put on standby and whose internal humidity (amount of moisture) is adjusted to reduce a difference in the amount of moisture contained in resist films of respective wafers at the time of heating after exposure.

PRIOR ART DOCUMENTS

Patent Documents

Patent Document 1: Japanese Patent Laid-Open Publication No. 2020-119961

SUMMARY

According to one embodiment of the present disclosure, a substrate processing system is provided with a plurality of apparatuses to perform a patterning on a plurality of the substrate, wherein a transfer container accommodating the plurality of substrates is transferred to the plurality of apparatuses in a sequential manner. The substrate processing system includes: a first apparatus of the plurality of apparatuses, which is configured to form a metal-containing resist film on each of the plurality of substrates; a second apparatus of the plurality of apparatuses, which is configured to perform a development on the metal-containing resist film after exposure; and an atmosphere regulator having an accommodation space where the plurality of substrates, on each of which the metal-containing resist film before being subjected to the development is formed, are accommodated and configured to regulate an atmosphere of the accommodation space so as to regulate a degree of progress of a reaction of the metal-containing resist film on each of the plurality of substrates.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart illustrating an atmosphere adjustment in patterning.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
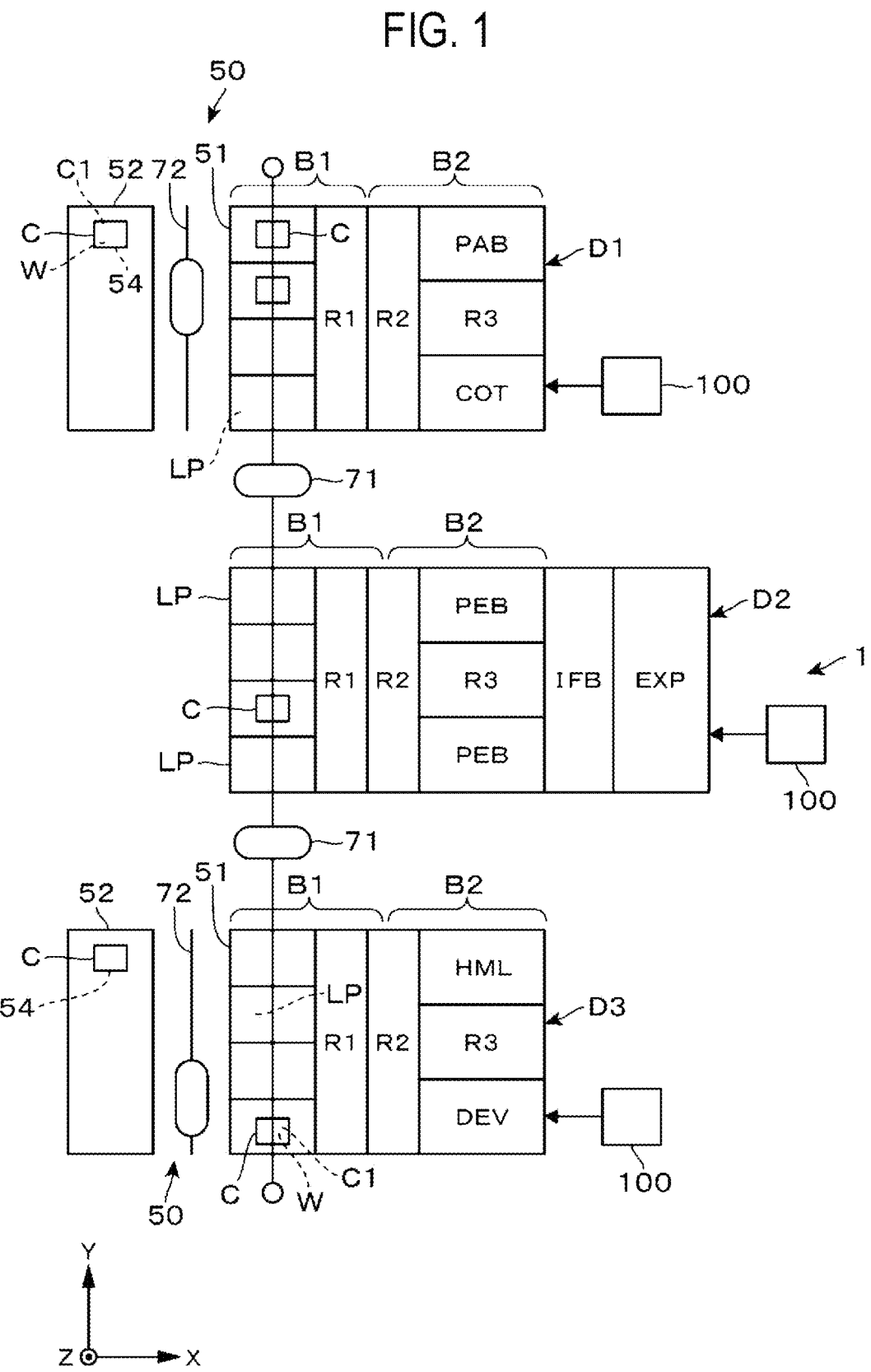
FIG. 1 is a schematic plan view illustrating a substrate processing system according to a first embodiment.
Figure 2:
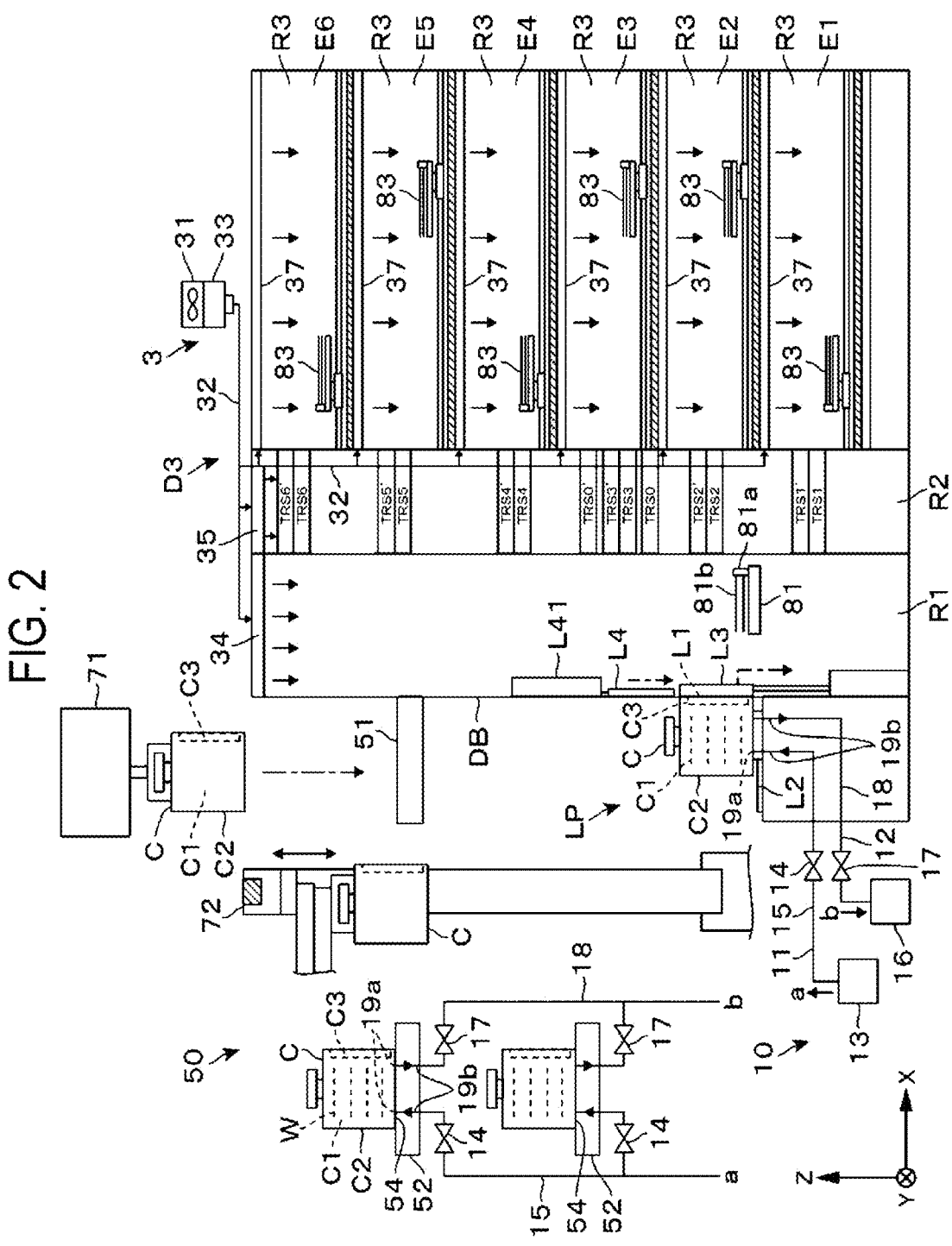
FIG. 2 is a vertical cross-sectional side view illustrating an apparatus which performs development in the substrate processing system.
Figure 3:
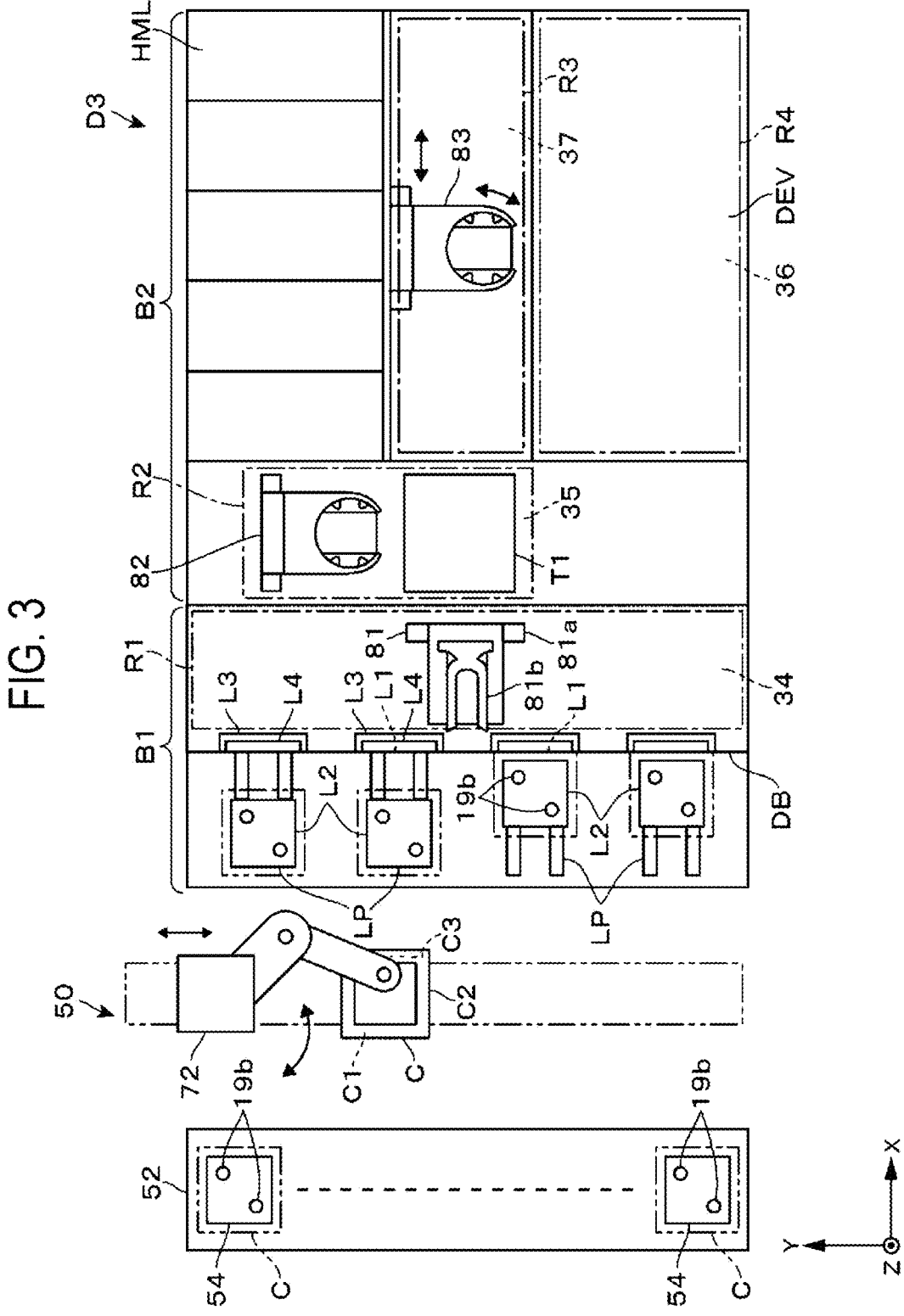
FIG. 3 is a horizontal cross-sectional plan view illustrating the apparatus which performs the development.

A substrate processing system 1, which is an embodiment of a substrate processing system of the present disclosure, will be described with reference to FIGS. 1 to 3. FIG. 1 is a schematic plan view of the substrate processing system 1.

The substrate processing system 1 is a system which performs patterning of a resist film on a substrate W, which is a semiconductor wafer, by photolithography, and includes apparatuses D1 to D3 provided under an air atmosphere. The apparatuses D1 to D3, which are substrate processing apparatuses, are independent of each other. The expression "are independent of each other" used herein means that an exposed substrate W does not move and is transferred while being accommodated in a transfer container C. The transfer container C is a substantially rectangular parallelepiped transfer container called a front opening unify pod (FOUP), and accommodates a plurality of substrates W arranged vertically. The transfer container C is transferred sequentially to the apparatuses D1 to D3. In each apparatus, the substrate W is taken out from the transfer container C and subjected to processes so that a resist pattern is formed on the substrate W. The transfer of the transfer container C between the apparatuses D1 to D3 is performed by an overhead hoist transfer (OHT) 71, which is a transfer mechanism of a semiconductor device manufacturing factory in which the substrate processing system 1 is installed.

In the apparatuses D1 to D3, various processing modules are allocated and provided to perform operations such as forming a resist film by applying a resist, heating the substrate W after exposing the resist film (post-exposure bake: PEB), and forming a pattern by developing the resist film. The apparatus D2 is connected to an exposure machine EXP. By allocating processing modules that perform a series of processes to the plurality of apparatuses in this way, even when some processing modules become unavailable due to maintenance or the like, and the apparatuses including the respective processing modules are no longer able to perform the processes, other apparatuses may continue to perform the processes. This suppresses a reduction in productivity of semiconductor devices. In addition to the processing modules, each of the apparatuses D1 to D3 includes a transfer mechanism configured to be transferred between the transfer container C and each processing module in the apparatus or the exposure machine, and a load port LP through which the substrate W is loaded and unloaded.

The resist applied to the substrate W in the substrate processing system 1 is a metal-containing resist, more specifically a metal oxide resist (MOR). In addition, the above-mentioned metal-containing resist contains a metal as a component of the resist, and does not mean a resist that contains the metal only as an impurity. The metal that is a component of the resist is, for example, tin (Sn). Hereinafter, unless otherwise specified, the term "resist" refers to MOR. This MOR is, for example, a negative resist.

After being applied to the substrate W, the MOR is denatured by reacting with components contained in the air, and a line width (critical dimension: CD) of a resist pattern formed on the resist film changes. It is believed that, when ligands are removed from metal atoms in an exposed region of the resist film by exposure with the exposure machine, a reaction with atmospheric components occurs more easily, that is, the resist film is more likely to be denatured after exposure. In addition, when exposed to an acidic gas or an organic gas, which will be described later, as in the case of exposure to the air, a reaction between the components of these gases and the MOR proceeds, resulting in denaturation of the MOR.

As described above, in the substrate processing system 1, the transfer of the substrate W is performed by the OHT 71 across the apparatuses D1 to D3 independent of each other. Until the patterning is completed, a period of time during which the substrates W in the transfer container C are exposed to the air may deviate from a scheduled period of time depending on a situation of the transfer of the transfer container C between the apparatuses by the OHT 71. The substrate processing system 1 is configured such that an atmosphere of a nitrogen ($N_2$) gas, which is an inert gas, is formed in a space in which the plurality of substrates W are accommodated. While the substrates W are accommodated in this space and exposed to the $N_2$ gas atmosphere, denaturation of the resist films on the substrates W may be suppressed. By appropriately setting the period of time during which the substrates are exposed to the $N_2$ gas atmosphere to adjust a degree of progress of the denaturation of the resist films, the CD of the resist pattern of each substrate W is set to a desired value. The space in which the $N_2$ gas atmosphere is formed is specifically an inner-container space C1 in the transfer container C, and the $N_2$ gas atmosphere may be formed at a plurality of locations in the apparatuses. In addition, in other substrate processing systems to be described later, in addition to the inner-container space C1 in the transfer container C, a storage space 42 in a buffer module, which is a module provided in the apparatus to accommodate the plurality of substrates, also corresponds to the above-mentioned space.

Each substrate W belonging to a same lot is stored in a common transfer container C. By transferring the substrates W belonging to the same lot to the space where the above $N_2$ gas atmosphere is formed, it is possible to improve the uniformity of the CDs of patterns within the same lot. By appropriately regulating periods of time during which different lots are exposed to the $N_2$ gas atmosphere, it is also possible to improve the uniformity of the CDs of patterns among different lots.

In this substrate processing system 1, patterning is performed by performing PEB and development only once, but as will be exemplified later as another substrate processing system, a system configuration may be adopted in which patterning is performed by repeating PEB and development multiple times. A first round of PEB and development is processes for forming a pattern, and second and subsequent rounds of PEBs and developments are processes for shaping the pattern. The above-mentioned patterning is a series of processes from the time when the resist film is formed until the time when the development is completed, but when the PEB and development are repeated, the above-mentioned patterning refers to the processes up to the final development. In addition, when repeating the PEB and development, etching on a film under the resist film (an underlying film) is not performed until the shaping is completed. That is, the process from the time when forming the resist film until the time when the final development is performed before performing a first round of etching on the underlying film corresponds to patterning described in the present specification.

Before explaining the substrate processing system 1 in detail, the transfer container C will be described with reference to FIG. 2. The transfer container C includes a container body C2 and a lid C3. In a state where an opening formed on a side of the container body C2 is closed by the lid C3, the inner-container space C1 is kept airtight. The substrates W are arranged vertically in the inner-container space C1. Two mounting holes 19*a* are provided in a bottom wall of the container body C2 so as to correspond to relay connectors 19*b* (FIG. 3) which will be described later. Gas is supplied to and exhausted from the inner-container space C1 via the mounting holes 19*a*. The mounting holes 19*a* are closed by valves (not illustrated) when the relay connectors 19*b* are not connected, so that the airtightness of the inner-container space C1 is maintained.

The apparatuses D1 to D3 which constitute the substrate processing system 1 have similar configurations, and the apparatus D3 will be described as a representative. The apparatus D3 includes a loading/unloading block B1 for loading/unloading the substrate W, and a processing block B2 in which processing modules for patterning are arranged. The loading/unloading block B1 and the processing block B2 are connected to each other in the left-right direction. When the loading/unloading block B1 side is referred to as a left side, the front thereof is referred to as a front side. The apparatus D3 includes a housing for each block, and is configured to keep an interior of the housing airtight with respect to an external ambient atmosphere. A transfer region in which the substrates W are transferred and an arrangement region in which the processing modules are arranged are formed within the housing.

The loading/unloading block B1 will be described. A sidewall of a housing DB of the loading/unloading block B1 includes a plurality of load ports LP arranged in a front-rear direction. Each of the load ports LP includes a substrate loading port L1 which is a through-hole formed in the sidewall of the housing DB, a stage L2 provided outside the housing DB to place the transfer container C thereon, and a door L3 that open/closes the opening inside the housing DB. The stage L2 is movable to the left and right, and moves between an unloading position relatively far from the substrate loading port L1 and a loading position close to the substrate loading port L1. In a state illustrated in FIG. 3, the two stages L2 on the left side are in the unloading positions, and the two stages L2 on the right side are at the loading positions.

Figure 4:
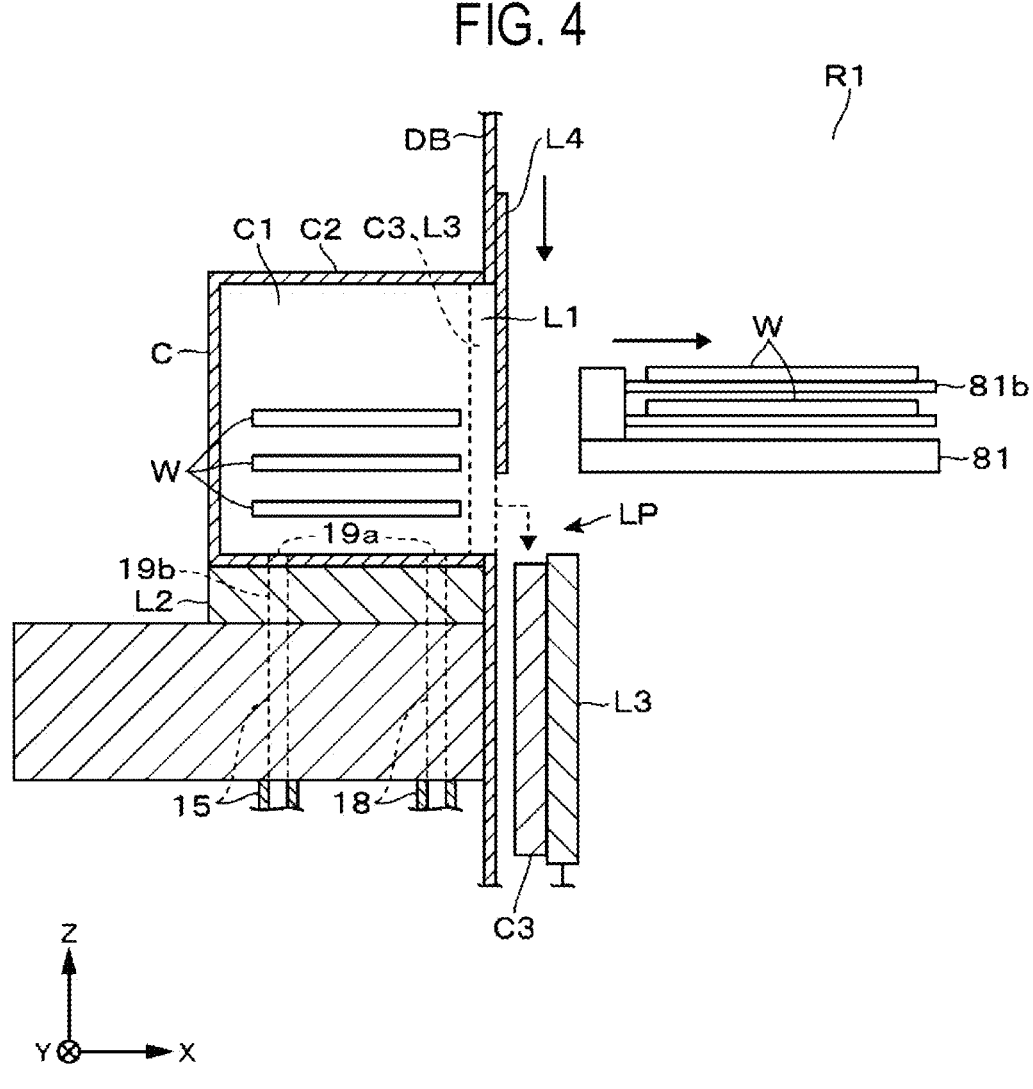
FIG. 4 is a partial cross-sectional side view illustrating an accommodation container and a load port at a loading position.

The transfer containers C are delivered to and from the stages L2 at the unloading positions. As illustrated in FIG. 4, the opening of the container body C2 of each transfer container C at the loading position is in close contact with an opening edge of the substrate loading port L1. The door L3, which functions as a lid detachable mechanism, attaches and detaches the lid C3 to and from the container body C2 at the loading position. The lid C3, which is removed from the container body C2, is held by the door L3 and moves together with the door L3 downward in the substrate loading port L1 to open the substrate loading port L1, so that the substrate W may be delivered between the container body C2 and the loading/unloading block B1.

Two relay connectors 19*b* are provided on the stage L2 and connected to respective mounting holes 19*a* of the transfer container C placed on the stage L2. One relay connector 19*b* is connected to a N$_2$ gas source 13 via a gas flow path 15, and the other relay connector 19*b* is connected to an exhaust path 16 of the factory via an exhaust flow path 18. By opening and closing a valve 14 provided in the gas flow path 15, the supply and cutoff of a N$_2$ gas into the transfer container C is performed. By opening and closing the valve 17 provided in the exhaust flow path 18, it is possible to switch between a state in which the interior of the transfer container C is exhausted and a state in which such an exhaust is stopped. For example, when the N$_2$ gas is supplied into the transfer container C, the exhaust is also performed.

The interior of the housing DB is configured as a substrate transfer region R1. A substrate transfer mechanism 81 configured to transfer the substrate W from/into the transfer container C into/from the substrate transfer region R1 is disposed inside the housing DB. The substrate transfer mechanism 81 includes a base body 81*a* configured to move back and forth and up and down in the substrate transfer region R1, and a support 81*b* configured to move back and forth on the base body 81*a* to support the substrate W. The substrate transfer mechanism 81 is able to deliver the substrate W between the transfer container C and the tower T1 provided in the processing block B2. A ceiling within the housing DB is configured as a gas supplier 34 which supplies gas downward in the substrate transfer region R1. This gas supplier 34 will be described in detail together with the gas suppliers 35 and 36 in the processing block B2.

In addition to the door L3, a shutter (an opening/closing mechanism) L4 is provided in the substrate transfer region R1 to open and close the substrate loading port L1. The shutter L4 is moved up and down along an inner surface of the housing DB by a drive mechanism L41 disposed inside the housing DB. More specifically, the shutter L4 moves between a closing position at which the substrate loading port L1 is covered and an opening position above the substrate loading port L1 and spaced apart from the substrate loading port L1. The closing of the substrate loading port L1 by the door L3 is performed such that the door L3 is in close contact with an inlet edge of the substrate loading port L1, but the closing of the substrate loading port L1 by the shutter LA is performed such that a slight gap is formed between the inlet edge of the substrate loading port L1 and the door L3, so that the movement of the shutter L4 between the closing position and the opening position is performed quickly.

In the state in which the door L3 is open (spaced apart from the substrate loading port L1), the shutter L4 opens and closes the substrate loading port L1. Except when the support 81*b* of the substrate transfer mechanism 81 enters the container body C2 of the transfer container C, the shutter L4 closes the substrate loading port L1. As a result, a decrease in concentration of the N$_2$ gas in the inner-container space C1 of the transfer container C is suppressed, and the progress of the above-mentioned MOR reaction is suppressed more reliably. The ceiling within the housing DB is configured as the gas supplier 34, which supplies gas downward in the substrate transfer region R3. This gas will be additionally described later.

A loading/unloading shelf 51 is provided outside the housing DB in the loading/unloading block B1 and above the load port LP. The OHT 71 delivers the transfer container C to the loading/unloading shelf 51. In addition, on the left side of the loading/unloading block B1, a plurality of vertically-stacked waiting shelves 52 are provided. The transfer containers C may be placed on each of the shelves 51 and 52. A delivery mechanism 72 includes a holder for the transfer container C that is movable forward, backward, leftward, and rightward to deliver the transfer container C among the loading/unloading shelf 51, the waiting shelf 52, and the stage L2 of the load port LP. The delivery mechanism 72, the loading/unloading shelf 51, and the waiting shelf 52 are referred to as a delivery unit 50 provided additionally in the loading/unloading block B1.

The loading/unloading shelf 52 includes a plurality of stages 54 arranged in the front-rear direction. The transfer container C is placed on each stage 54. Similarly to the stage L2 of the load port LP, each stage 54 is provided with two relay connectors 19*b*. The two relay connectors 19*b* are connected to the N$_2$ gas source 13 and the factory exhaust path 16 via the gas flow path 15 and the exhaust flow path 18. In addition, similarly to the interior of the transfer container C on the stage L2, by opening and closing the valves 14 and 17 provided in the gas flow path 15 and the exhaust flow path 18, the supply and exhaust of the N$_2$ gas may be performed with respect to the interior of the transfer container C on the stage 54 so that an $N_2$ gas atmosphere may be created around the substrates W accommodated in the transfer container C. The gas flow path 15 and the exhaust flow path 18 are configured such that the supply and exhaust of the $N_2$ gas may be independently performed with respect to the transfer container C on each stage 54 and the transfer container C on each stage L2. The gas flow path 15, the exhaust flow path 18, the valves 14 and 17, and the $N_2$ gas supply source 13 are configured as an atmosphere regulator configured to regulate an atmosphere of the space in which the substrates W are accommodated.

The transfer container C is transferred in the order of the OHT 71, the delivery mechanism 72, the loading/unloading shelf 51, the delivery mechanism 72, the stage 54 of the waiting shelf 52, the delivery mechanism 72, and the stage L2 of load port LP, so that the substrate W is loaded into the apparatus. Subsequently, the transfer container C is transferred in the order of the delivery mechanism 72, the stage 54, the delivery mechanism 72, and the stage L2 so that the substrate W transferred from the apparatus is stored. Then, the transfer container C is transferred in the order of the delivery mechanism 72, the stage 54, the delivery mechanism 72, the loading/unloading shelf 51, and the OHT 71. The stage 54 functions as a keeper for retreating and keeping the transfer container C to prevent the load port LP from being occupied by the transfer container C in which the substrates W are not being transferred.

Next, the processing block B2 will be described. The processing block B2 includes floors E1 to E6 which are partitioned from one another. The tower T1 that spans the floors E1 to E6 is provided on the left side of the processing block B2. A substrate transfer mechanism 82, which is movable between the floors E1 to E6 and delivers the substrates W between the modules of the tower T1, is provided on the back side of the tower T1. A region where the substrates are transferred by the substrate transfer mechanism 82 (that is, a region around the tower T1 on the back side of the tower T1) is referred to as a substrate transfer region R2. A ceiling in the substrate transfer region R2 is configured as a gas supplier 35 and supplies gas downward in the substrate transfer region R2.

The floors E1 to E6 are similar in configuration to one another. The substrate W is transferred to one of the floors where the wafer W is subjected to a process. The floor E3 will be described as a representative of the floors. A substrate transfer region R3 is provided to extend left and right in the center in the front-rear direction. The right side of the tower T1 faces the substrate transfer region R3. The substrate transfer region R3 is provided with a substrate transfer mechanism 83 to deliver the substrate W to the modules around the substrate transfer region R3.

A developing module DEV is provided in front of the substrate transfer region R3 to develop the resist film by supplying a developing solution to the substrate W. For example, a region in which the "developing module DEV" is provided in the processing block B2 is referred to as a "developing block" in the claims. This region is indicated as DEV in the drawings. The developing module DEV includes a housing and a processor for the substrate W provided within the housing. The interior of the housing is illustrated as a substrate transfer region R4. A ceiling inside the housing is configured as a gas supplier 36 and supplies gas downward in the substrate transfer region R4.

A heating block in which a plurality of heating modules HML are arranged side by side on the left and right is disposed behind the substrate transfer region R3. Each heating module HML heats the substrate W after development. The heating module HML includes a housing that accommodates the substrate W. The interior of the housing is exhausted to draw in the atmosphere of the substrate transfer region R3. In other words, the atmosphere of the heating module is the same as that of the substrate transfer region R3.

The ceiling forming the substrate transfer region R3 is configured as a gas supplier 37, and supplies gas downward in the substrate transfer region R3. Each of the gas suppliers 34 to 37 described so far is configured to include a gas flow path, and a supply port which supplies the gas supplied from the gas flow path to each of the substrate transfer regions R1 to R4 provided below the respective gas suppliers 34. A downstream end of the duct 32 is connected to the gas suppliers 34 to 37. A fan 31 is provided at an upstream end of the duct 32. Thus, an ambient atmosphere of a room where the substrate processing system 1 is installed is drawn into the duct 32 and supplied to each of the gas suppliers 34 to 37. A removal filter (a component remover) 33 is interposed in the duct 32.

The removal filter 33 is a chemical filter capable of removing not only fine particles but also certain gas components contained in the air, and removes ammonia ($NH_3$), amine, an acidic gas, and an organic gas. As a result, purified atmosphere is supplied to the gas suppliers 34 to 37 and is oriented downward to form an airflow. Supply ports provided in the gas suppliers 34 to 37 may be holes in a filter paper, holes in a surface of a porous body, or extremely minute holes. In addition, the acidic gas contains carbon dioxide, hydrogen sulfide, hydrogen chloride, chlorine, nitric acid, nitrogen dioxide, and sulfur dioxide. The organic gas is a gas composed of volatile organic compounds such as alcohol and acetone. The gas suppliers 34 to 37, the duct 32, the fan 31, and the removal filter 33 constitute an airflow generator 3.

The above-mentioned tower T1 is provided with a large number of stacked transfer modules TRS in each of which the substrates W are temporarily placed. The transfer modules TRS provided at respective heights corresponding to the floors E1 to E6 are illustrated by the same numeric characters as those of the floors E1 to E6. In addition, one side of the transfer module TRS0 is for loading to the tower T1, and the other side thereof is for unloading from the tower T1. Modules used for unloading the substrate W from the tower T1 to the loading/unloading block B1 are indicated with a single quotation mark (') after the numeric characters to distinguish them from other modules used for loading. That is, the substrate W to be processed on the floor E1 is transferred in the order of the transfer container C, the transfer module TRS0, a transfer module TRS1, the floor E1, a transfer module TRS1', a transfer module TRS0', and the transfer container C.

The apparatus D3 includes a controller 100. The controller 100 is constituted with a computer including a CPU and a storage, and controls components of the apparatus D3. The storage stores a program in which a group of steps (commands) for controlling the operations of various processing modules and transfer mechanisms, and the supply and exhaust of the $N_2$ gas to and from the transfer container C are incorporated. This program is stored, for example, in a storage medium, such as a hard disk, a compact disk, a magneto optical disk, a memory card, or a nonvolatile memory, and is installed from the storage medium in the computer.

The apparatuses D1 and D2 will be described by focusing on their differences from the apparatus D3. In the apparatus D1, the processing block B2 is provided with a coating module COT that coats a resist to form a resist film, in place of the developing module DEV. In addition, a first heating module PAB configured to perform a heat treatment (Post Apply Bake: PAB) on the substrate before exposure is provided in place of the heating module HML. Further, the airflow generator 3 includes a filter different from the removal filter 33. This filter is a filter for removing particles, and has a lower removal performance with respect to $NH_3$, amines, acidic gases, and organic gases than that of the removal filter 33. This filter may not have such a removal performance. This is because, as mentioned above, the influence of the air after exposure on the denaturation of the resist is relatively large. However, the removal filter 33 may be provided.

In the apparatus D2, the processing block B2 is provided with a second heating module PEB configured to perform a heat treatment (Post Exposure Bake: PEB) on the substrate after exposure and before development, in place of the heating module HML. The exposure machine EXP is connected to the right side of the processing block B2. The apparatus D2 includes an interface block IFB interposed between the processing block B2 and the exposure machine EXP. By a substrate transfer mechanism provided in the interface block IFB, the substrate W is transferred between the apparatus D2 and the exposure machine EXP. A configuration example of the interface block IFB will be described in a second embodiment. In addition, since the apparatus D2 is not provided with the delivery unit 50, the OHT 71 directly delivers the transfer container C to the load port LP.

The controller 100 is also provided in each of the apparatuses D1 and D2. Operations of components of each of the apparatuses D1 and D2 are controlled by the controller 100. Each controller 100 is connected to a host computer (not illustrated) in the factory. The operation of the OHT 71 is controlled by the host computer. Processes on the substrates W in respective apparatuses D1 to D3 are performed according to a transfer situation of the transfer container C by the OHT 71.

Figure 5:
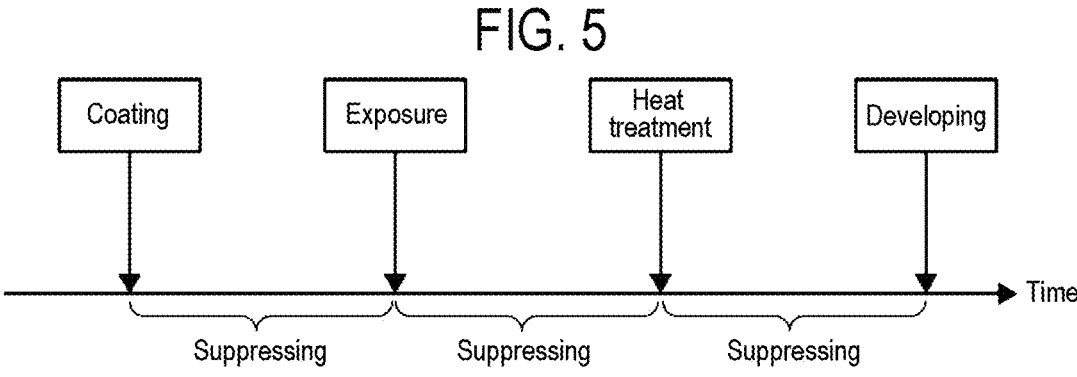
FIG. 5 is a schematic view illustrating atmosphere adjustment in the accommodation container in patterning.

An example of patterning performed on each substrate W accommodated in one transfer container C in the above-mentioned substrate processing system 1 will be described with reference to a schematic view illustrated in FIG. 5 and a flowchart illustrated in FIG. 6. As shown in the schematic view, the substrate processing system 1 performs the patterning to suppress the progress of denaturation of the resist by suppressing a reaction with each component contained in the atmosphere from the coating of the resist to the development.

First, when the transfer container C accommodating the plurality of substrates W, on each of which no resist film is formed, is transferred to the apparatus D1 by the OHT 71, so that the substrates W accommodated in the transfer container C are sequentially transferred to the interior of the apparatus D1, the transfer container C is retreated to the waiting shelf 52. Then, each substrate W is transferred in the order of the coating module COT and the first heating module PAB where the formation of the resist film and the heat treatment are sequentially performed (step S1). The transfer container C is transferred to the load port LP, and the supply and exhaust of the $N_2$ gas are performed so that the interior of the transfer container C is filled with the $N_2$ gas. Then, the substrates W subjected to PAB are sequentially collected by the respective transfer container C. At this time, the opening and closing of the shutter LA are performed as described above, and a decrease in concentration of the $N_2$ gas inside the transfer container C is suppressed (step S2).

After accommodating the substrates W, the transfer container C is transferred to the waiting shelf 52, and the supply and exhaust of the $N_2$ gas are performed during the waiting so that the concentration of the $N_2$ gas inside the transfer container C is increased (step S3).

Thereafter, the transfer container C is transferred by the OHT 71 to the load port LP of the apparatus D2, and the supply and exhaust of the $N_2$ gas are performed so that the concentration of the $N_2$ gas inside the transfer container C is increased. Then, the substrates W are sequentially unloaded from this transfer container C. During this unloading, the opening and closing of the shutter L4 are performed as described above to prevent the concentration of the $N_2$ gas inside the transfer container C from being decreased (step S4). The substrates W are transferred via the processing block B2 to the exposure machine EXP where they are exposed along the patterns. Thereafter, the substrates W are returned to the processing block B2 where they are subjected to PEB (step S5). By performing the supply and exhaust of the $N_2$ gas with respect to the transfer container C in the load port LP, the interior of the transfer container C is filled with the $N_2$ gas. Then, the substrates W are sequentially collected by the transfer container C. At this time, the opening and closing of the shutter L4 are performed in the same way as when collecting the substrates W in the apparatus D1, and a decrease in concentration of the $N_2$ gas inside the transfer container C is suppressed (step S6).

Thereafter, the transfer container C is transferred to the apparatus D3 by the OHT 71 and delivered to the waiting shelf 52. By performing the supply and exhaust of the $N_2$ gas during the waiting on the waiting shelf 52, the concentration of the $N_2$ gas inside the transfer container C increases (step S7). Subsequently, the transfer container C is transferred to the load port LP of the apparatus D3, and the supply and exhaust of the $N_2$ gas are performed so that the concentration of the $N_2$ gas inside the transfer container Cis increased. Then, the substrates W are sequentially unloaded from the respective transfer container C. During this unloading, the opening and closing of the shutter L4 are performed as described above to prevent the concentration of the $N_2$ gas inside the transfer container C from being decreased (step S8). The resist film is removed along a circuit pattern by the developing solution so that a resist pattern is formed on the substrate W. Thereafter, each substrate W undergoes the heat treatment in the heating module HML (step S9). Then, the transfer container C accommodating the collected substrates W is transferred by the OHT 71 to an apparatus which performs a next process (step S10).

As described above, according to the substrate processing system 1, during respective processes from the formation of the resist film to the development, the substrates W are accommodated by the load port LP and the waiting shelf 52 in the inner-container space C1 whose atmosphere is regulated to have the $N_2$ gas atmosphere, thereby suppressing the progress of the reaction of the resist film with the air. As a result, it is possible to regulate the line width of the resist pattern on the substrate W to a desired line width, while suppressing unnecessary expansion of the line width.

In addition, according to the substrate processing system 1, each of the apparatuses D2 and D3, which process substrates W after exposure, includes the airflow generator 3 equipped with the removal filter 33. Thus, the purified air flows in the form of a downward flow toward the substrate transfer regions R1 to R4 where the substrates are transferred or processed, thereby suppressing the reaction of the resist films of the substrates W with the air during the transfer operation and the processing operation. This makes it possible to more reliably suppress the expansion of the line width of the resist patterns on the substrates W during the transfer operation and the processing operation.

The reaction of the resist film with the air may be suppressed by supplying an inert gas other than the $N_2$ gas, such as argon gas, into the transfer container C, instead of the above-mentioned $N_2$ gas. In addition, it is believed that various components in the air react with MOR, and react with moisture in the air so that MOR is denatured. Therefore, low-humidity air (atmosphere) may be supplied into the transfer container C instead of the inert gas. Specifically, this low-humidity air is, for example, air with a humidity lower than that of a room in which the substrate processing system 1 is installed. For example, during the operation of the substrate processing system 1, the humidity is measured ten times or more randomly at different times. When the humidity of the air supplied into the transfer container C is lower than the average of humidity, the air corresponds to the low-humidity air. The humidity used in this specification is a relative humidity unless otherwise specified.

When supplying the $N_2$ gas to the inner-container space C1 of the transfer container C at the load port LP as described above, the concentration of the $N_2$ gas may be set to a relatively high level to suppress the reaction of the resist of the substrate W in the inner-container space C1 with the air. A period for supplying the $N_2$ gas is optional. Therefore, the $N_2$ gas may be supplied only until the lid C3 is removed from the container body C2 of the transfer container C. Further, the $N_2$ gas may be supplied until the loading or unloading of each substrate W into or out of the container body C2 is completed after the lid C3 is removed from the container body C2. In addition, the supply of the $N_2$ gas may be performed even after the substrates W have been completely stored in the container body C2 and the lid C3 has been installed to the container body C2.

In the above example, the $N_2$ gas is supplied at all locations on the transfer path of the transfer container C where the $N_2$ gas can be supplied. Alternatively, the $N_2$ gas may be supplied only at some locations. Alternatively, the $N_2$ gas may be supplied at a specific location according to conditions. For example, it is assumed that the apparatus D2 is also provided with the delivery unit 50 like the apparatuses D1 and D3, and the transfer container C is transferred to the waiting shelf 52 before being transferred to the load port LP. At a timing when the transfer container C is placed on the waiting shelf 52, when an expected period of time required for the substrate W in the transfer container C to be transferred to the exposure machine EXP (an exposure-machine transfer time) is longer than a preset allowable time, the supply of the $N_2$ gas is performed at that timing. When the exposure-machine transfer time is equal to or less than the preset allowable time, the supply of the $N_2$ gas may not be performed.

Specifically, for example, the substrates W are considered to be loaded into the apparatus D2 at a constant time interval T. The controller may calculate the following: the exposure-machine transfer time=the number of substrates W loaded until the first substrate W in the transfer container C at the time of being placed on the waiting shelf 52 is transferred× the time interval T+the transfer time required for transferring the substrate W from the load port LP to the exposure machine EXP. The number of substrates W is the number of substrates that have not yet been loaded from another transfer container C into the apparatus D2. In addition, the time interval T and the exposure-machine transfer time to the exposure machine EXP may be stored in the memory of the controller 100, for example, as constants. The present disclosure is not limited to determining whether or not to supply the $N_2$ gas based on a time taken until the substrates W are transferred to the exposure machine EXP. For example, whether or not to supply the N2 gas may be determined based on a time spent in transferring the substrate to a specific module such as the heating module PEB.

In the substrate processing system 1, the internal atmosphere of the container internal space C1 is regulated such that the reaction of the resist film with the air is suppressed, but the present disclosure is not limited thereto. The internal atmosphere may be regulated such that the reaction of the resist film with the air is promoted. By promoting the reaction and saturating various reactions that may occur in the resist film until the development is performed on each substrate W, the line widths of the patterns are made uniform among the substrates W.

Figure 7:
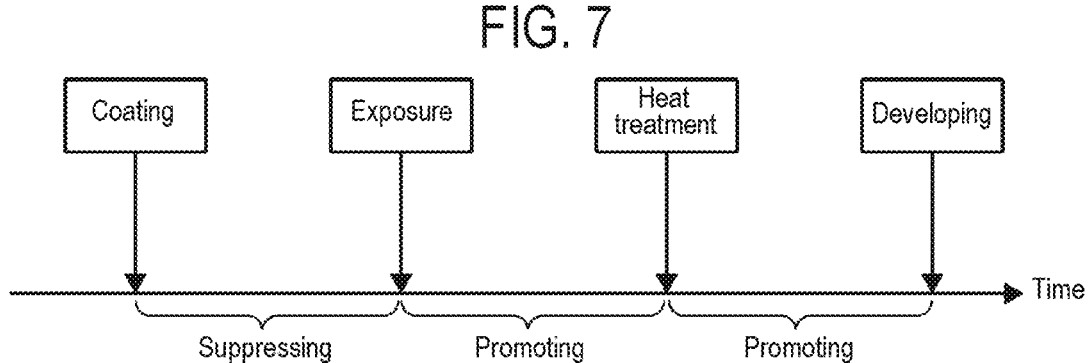
FIG. 7 is a schematic view illustrating another atmosphere adjustment in patterning.

Specifically, as illustrated in FIG. 7, during the period from the exposure by the exposure machine EXP until the time when PEB (heat treatment) is performed by the heating module, and during the period from PEB by the heating module until the time when the development is performed by the exposure machine EXP, a reaction-promoting gas is supplied instead of the $N_2$ gas at the above-described locations where the $N_2$ gas is supplied. As such a gas (the reaction-promoting gases), for example, high-humidity air that has been humidified to bring it close to saturated water vapor pressure, air with a high concentration of carbon dioxide and oxygen, carbon dioxide gas, oxygen gas, or the like may be used. This high-humidity air is, for example, air with a humidity higher than that of the room in which the substrate processing system 1 is installed. For example, when the humidity of the air supplied into the transfer container C is higher than the average humidity obtained by randomly measuring the humidity ten times or more at different times during the operation of the substrate processing system 1, the air corresponds to the high-humidity air. The air with a high concentration of carbon dioxide and oxygen is air with a higher concentration of carbon dioxide and oxygen than the air (atmosphere) in the room in which the substrate processing system 1 is installed. For example, during the operation of the substrate processing system 1, the concentrations of carbon dioxide and oxygen in the room are randomly measured ten times or more at different timings, and air with a concentration higher than the average of the concentrations corresponds to the air with a high concentration of carbon dioxide and oxygen. In addition, an acidic gas, an organic gas, an amine gas, and a radical gas may also cause the reaction of the resist film. In view of the foregoing, the reaction of the resist film may be prevented by decreasing concentrations of these substances in an atmosphere around the substrate W rather than the ambient air. Alternatively, these substances may be added to the atmosphere around the substrate W to increase the concentrations thereof compared to those in the ambient air, thus promoting or satisfying the reaction of the resist film. As a result, each of the plurality of substrates W may be stably processed. In the case where the concentrations of the substances are decreased in the atmosphere around the substrate W, gas capable of decreasing the concentrations of the substances compared to those in the ambient air by a gas filter or the like, may be supplied to the location to which the $N_2$ gas is supplied, instead of the $N_2$ gas. In the case where the concentrations of the substances are increased in the atmosphere around the substrate W, for example, a gas capable of increasing the concentrations of the substances compared to those in the ambient air may be prepared in advance, and may be supplied instead of the $N_2$ gas. This also holds true with respect to a location to which the $N_2$ gas is supplied, which will be described later. Various elements may be considered as elements contained in molecules constituting an oxidizing gas, the organic gas, the amine gas, the radical gas or the like. One or more of H, F, O, N, C, B, Cl, S, P, Si, Br and the like as element symbols may be the elements.

In addition, during the time interval from the exposure until the time when PEB is performed, the $N_2$ gas may be supplied to suppress the reaction, and only during the time interval from the time when PEB is performed until the time when the development is performed, the reaction-promoting gas may be supplied. In addition, the reaction-promoting gas may be supplied instead of the $N_2$ gas even from the time when the coating of the resist is performed until the time when the exposure is performed. However, the coating module COT may be configured such that one of multiple types of MORs is selected and is coated, and the type of MOR to be coated may be selected to correspond to the lot of substrates W. According to the type of MOR, the reactivity to the reaction-promoting gas before exposure may be low. Thus, it is considered that a difference in CDs of patterns between lots increases when a difference in a degree of reaction progress until the development is performed increases between lots. Therefore, from the viewpoint of making the CDs of patterns uniform among the lots, it is preferable to supply the $N_2$ gas to suppress the reaction from the time when the coating of the resist is performed until the time when the exposure is performed.

Further, it is considered that besides MOR being exposed to the reaction-promoting gas, the MOR undergoes a dehydration reaction in a depressurized atmosphere, thus causing a change in the dimensions of the pattern during the development. Therefore, by performing only the exhaust by the exhaust mechanism 12 without supplying gas by the gas supply mechanism 11 instead of supplying the reaction-promoting gas, the inner-container space C1 may be depressurized to promote the reaction.

Second Embodiment

Figure 8:
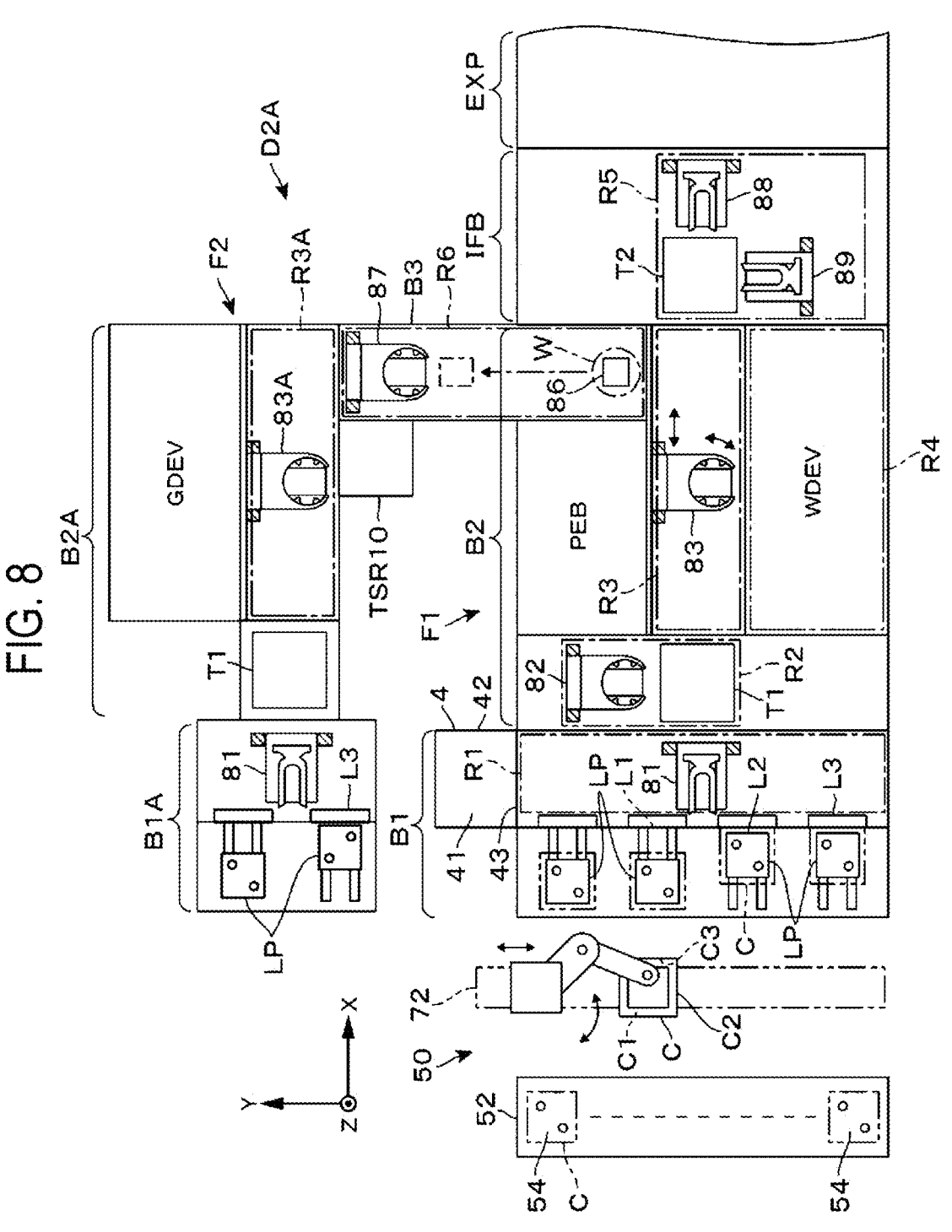
FIG. 8 is a schematic plan view illustrating a substrate processing system according to a second embodiment.

A substrate processing system 1A according to a second embodiment of the present disclosure will be described with reference to FIG. 8. In addition, in the following embodiments, differences from the first embodiment will be mainly described, and descriptions of the same configurations as those in the first embodiment will be omitted. FIG. 8 is a plan view illustrating a developing apparatus D2A, and illustrates the floor E3 for the processing block B2.

The substrate processing system 1A of the present embodiment includes an apparatus D1 and a developing apparatus D2A which are independent of each other. As in the apparatus D3 described in the first embodiment, the developing apparatus D2A includes a developing module which performs a gas-based development, in addition to the developing module DEV which performs the development using the developing solution. In order to distinguish these developing modules from each other, the developing module using the developing solution and the developing module using the gas-based development are sometimes referred to as a developing solution-based module WDEV and a developing gas-based module GDEV, respectively. In the present example, after being developed by the developing solution-based module WDEV, the substrate W is transferred to be developed by the developing gas-based module GDEV.

The developing apparatus D2A is provided with a structure F1 including the developing solution-based module WDEV and a structure F2 including the developing gas-based module GDEV. The structure F1 has almost the same configuration as the apparatus D3 described in the first embodiment except that the exposure machine EXP is connected to the right end of the processing block B2 via the interface block IFB. The structure F2 has generally the same configuration as the apparatus D3 except for the type and arrangement of processing modules installed, and the number of load ports LP, and except that the number of layers constituting the processing block is one.

The loading/unloading block and the processing block of the structure F2 will be denoted by reference numerals B1A and B2A, respectively, to distinguish them from the loading/unloading block B1 and the processing block B2 of the structure F1. In addition, in the processing block B2A, a substrate transfer mechanism corresponding to the substrate transfer mechanism 83 of the processing block B2 will be denoted by reference numeral 83A. The loading/unloading blocks B1 and B1A are spaced apart from each other and aligned in the front-rear direction, and the processing blocks B2 and B2A are spaced apart from each other and aligned in the front-rear direction. A substrate transfer block B3 is provided to interconnect the processing blocks B2 and B2A. The substrates W may be transferred between the structures F1 and F2 by a transfer mechanism provided in the substrate transfer block B3. Unloading of the substrates W from the transfer container C to the developing apparatus D2A is performed in the load port LP of the loading/unloading block B1. After unloading the substrates W, the transfer container C is delivered to the load port LP of the loading/unloading block B1A via the OHT 71 to collect processed substrates W.

The structure F1 will be further described. The structure F1 includes the heating module HML in place of the heating module PEB. In the floor E3, a front end portion of the substrate transfer block B3 is provided at a position corresponding to the arrangement region of one heating module HML in the apparatus D3. The substrate transfer block B3 includes a stage 86 configured to move rearward the substrate W placed thereon, and a substrate transfer mechanism 87 provided behind the stage 86. A transfer module TRS10 is provided on a side of the substrate transfer mechanism 87. It is assumed that the stage 86, the substrate transfer mechanism 87, and the transfer module TRS10 are arranged within a housing that constitutes the substrate transfer block B3, and are provided in a region separated from the air atmosphere around the developing apparatus D2A. In addition, as will be described later, the floor E1 includes no processing module because the substrates W directly pass through the floor E1 to be loaded into the exposure machine EXP.

After being subjected to the exposure process in the exposure machine EXP, the substrates W are processed by PEB and the developing solution-based module WDEV in the processing block B2, and then are transferred in the order of: the substrate transfer mechanism 83 on the floor E3, the substrate transfer block B3, the stage 86, the transfer modules TRS10, and the substrate transfer mechanism 83A in the processing block B2A of the structure F2. Then, after being transferred to the developing gas-based module GDEV, the substrates are collected by the transfer container C of the load port LP via the tower T1. As described above, the processing block B2A is connected to the exposure machine EXP via the substrate transfer block B3 and the interface block IFB, and the exposure machine EXP is configured to be shared by the processing blocks B2 and B2A.

The interface block IFB of the structure F1 will be described. The interface block IFB is provided with a tower T2 including a large number of stacked delivery modules TRS like the tower T1. Through the tower T2, the substrates may be transferred between the interface block IFP and each floor of the processing block B2. In addition, the interface block IFB includes transfer mechanisms 88 and 89. The transfer mechanism 88 is used to deliver the substrates W between the delivery modules TRS of the tower T2 and the exposure machine EXP, and the transfer mechanism 89 is used to deliver the substrates W between the delivery modules TRS of the tower T2.

The structure F2 will be described. Since the processing block B2A is provided as one layer in the structure F2, the structure F2 is not provided with the substrate transfer mechanism 82, which is provided in the structure F1 to transfer the substrates between layers. Further, the developing gas-based module GDEV is provided on the rear side of a substrate transfer region R3A corresponding to the substrate transfer region R3 of the structure F1. In the structure F2, air purified by the removal filter 33 is supplied as an air flow to the substrate transfer region R3A. The airflow formed in the substrate transfer region R3A flows into the developing gas-based module GDEV. Similarly to the loading/unloading block B1, the interface block IFB and the substrate transfer block B3 are also supplied with the air purified by the removal filter 33 from the ceiling in the form of a downward airflow. Regions where such downward airflows are formed are denoted by a region R5 and a region R6, respectively. In the present example, in the loading/unloading block B1A through which the substrate W on which the pattern has been formed passes, a downward airflow is considered to be formed by air purified by a filter different from the removal filter 33.

Figure 9:
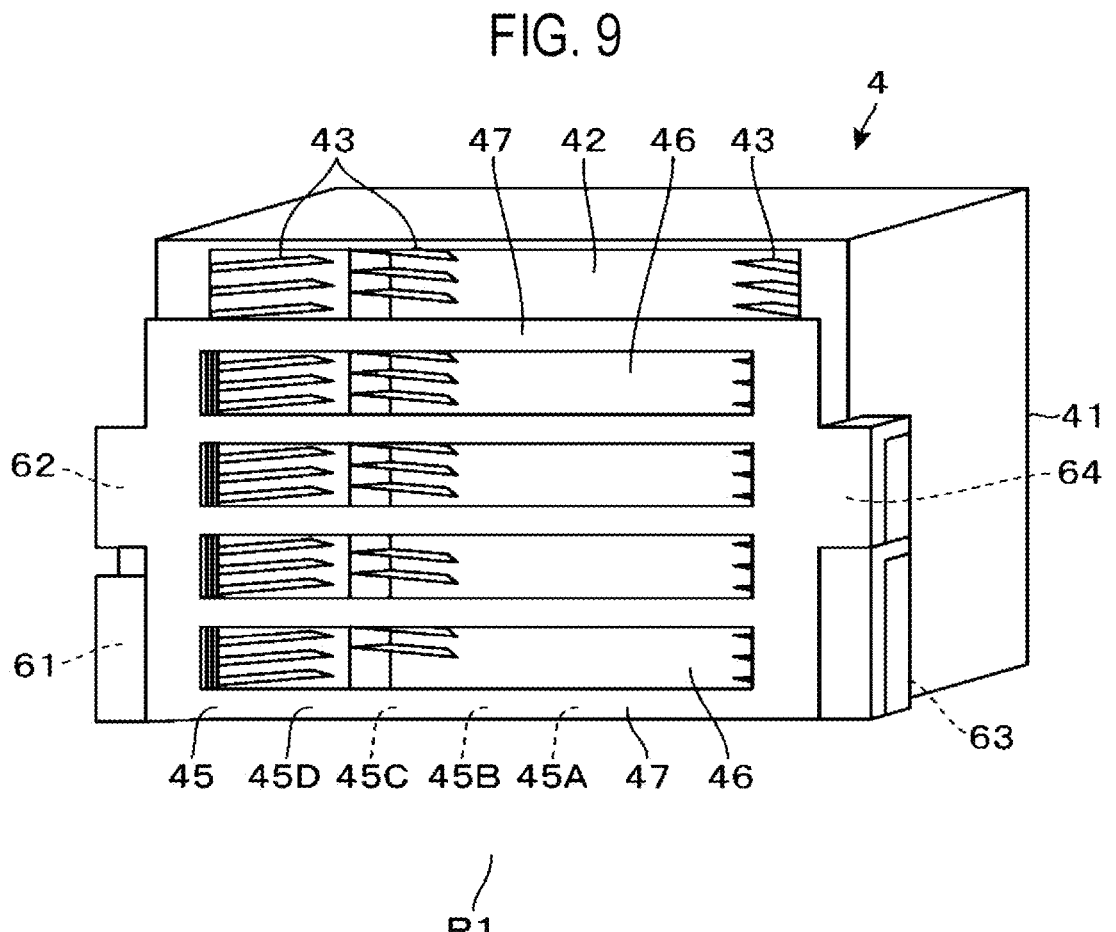
FIG. 9 is a perspective view illustrating a buffer module provided in the substrate processing system.

Further, the substrate processing system 1A of the present disclosure includes, for example, a buffer module (a storage module) 4 disposed in the loading/unloading block B1 of the developing apparatus D2A. A configuration of the buffer module 4 will be described with reference to perspective views of FIGS. 9 to 11. The buffer module 4, which is provided near the rear side of the substrate transfer region R1, stores the substrates W vertically side by side like the transfer container C, and includes a rectangular housing 41 configured to store the substrates W. The housing 41 has a configuration in which one of four sidewalls thereof is removed. A side where the sidewall is removed to be open as described above will be referred to as a front side of the housing 41.

Figure 10:
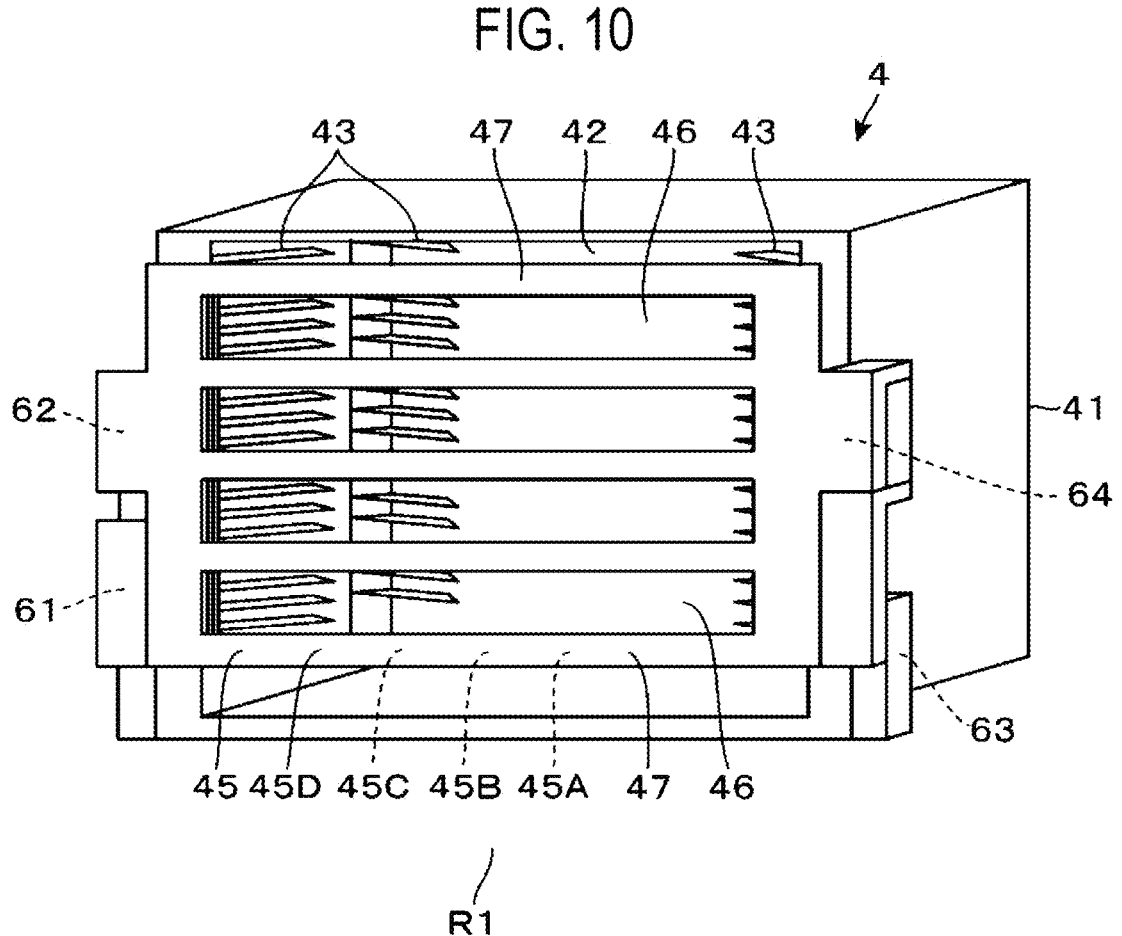
FIG. 10 is a perspective view illustrating a buffer module provided in the substrate processing system.
Figure 11:
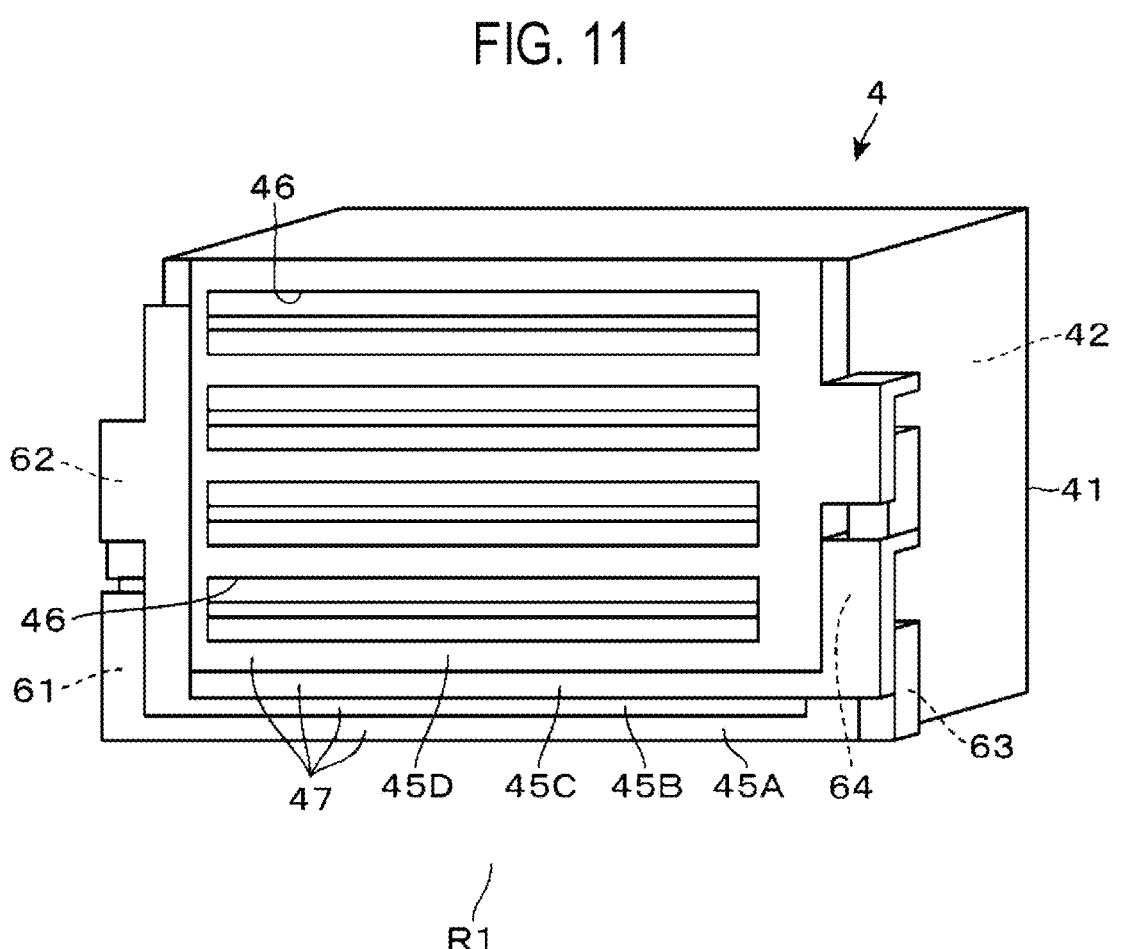
FIG. 11 is a perspective view illustrating a buffer module provided in the substrate processing system.

An interior of the housing 41 is configured as a storage space 42 for the substrate W. As illustrated in FIGS. 10 and 11, supports 43 configured to support the substrates W are provided on the sidewalls of the housing 41 in multiple stages. The supports 43 extend from four corners of the storage space 42, which is rectangular in a plan view, toward the center of the storage space 42. A set of four supports 43 located at the same heights supports a peripheral edge of the rear surface of one substrate W so that the substrate W waits in a horizontal posture. A waiting region for the substrate W, which is formed by the set of four supports 43 described above, is referred to as a slot. A large number (e.g., 18) of slots are provided. These slots may be numbered as a slot 1, a slot 2, a slot 3, and so on from bottom to top. A gas supplier 44 connected to an atmosphere regulator is provided at an inner side in the interior of the housing 41 (FIGS. 12A to 12C) like the stage L2. The $N_2$ gas is supplied from the gas supplier 44 toward a front side in the interior of the housing 41 so that the substrates W in the slots 1 to 18 are exposed to a flow of the $N_2$ gas.

Figures 12A, 12B:
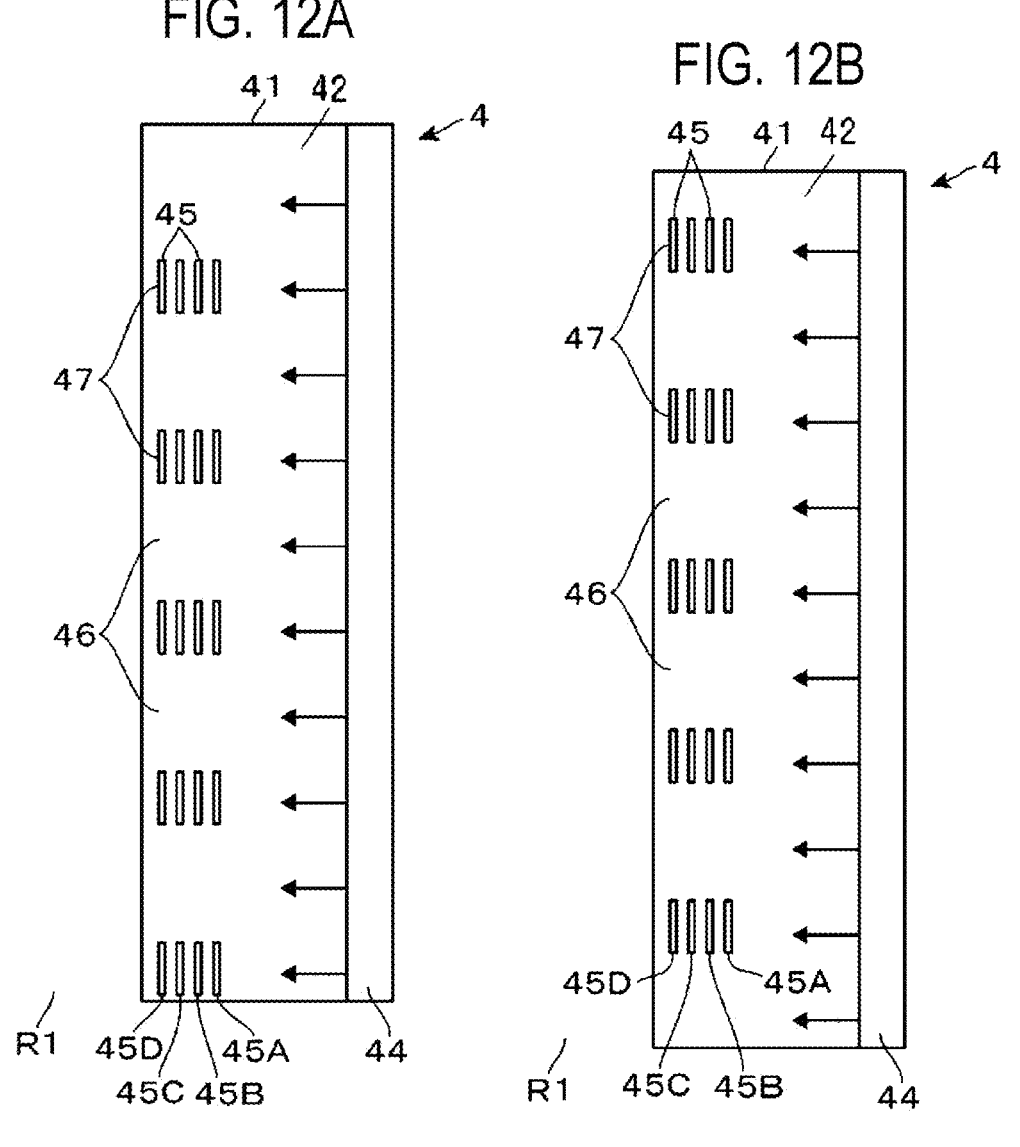
FIGS. 12A to 12C are vertical cross-sectional side views illustrating examples of a lifting pattern of a shutter.
Figure 12C:
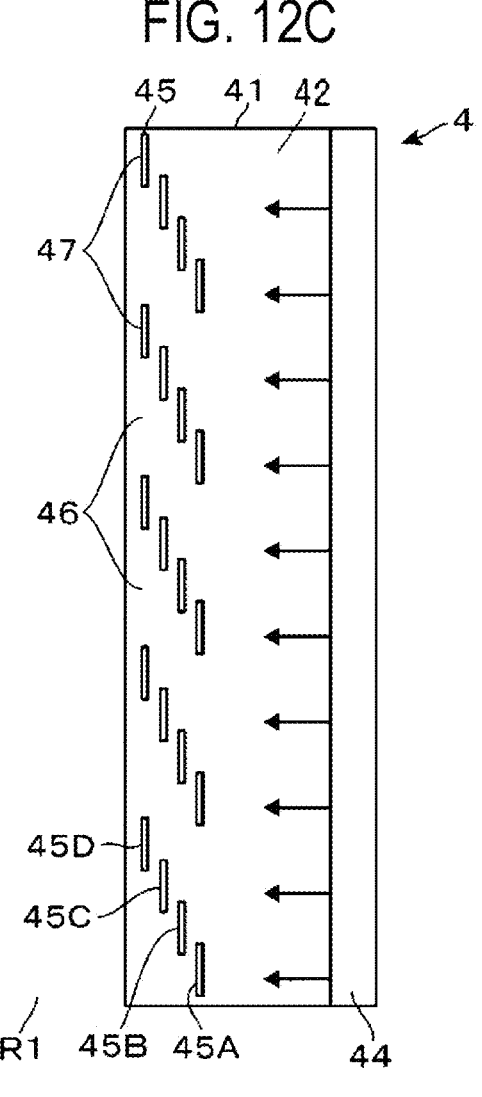

Four shutters (opening/closing members) 45 are provided on the front side of the housing 41. Positions of these four shutters 45 from the front side to the rear side are different from each other. Each of the shutters 45 is movable vertically, and may be switched between a state in which some of the slots are open to the substrate transfer region R1 outside the housing 41 (states illustrated in FIGS. 9 and 10) and a state in which all of the slots are partitioned from the outside of the housing 41 (a state illustrated in FIG. 11). The slots open to the outside may be changed. A configuration of the shutters 45 will be described in detail. The four shutters 45 are similar in configuration to each other. Each of the four shutters 45 includes four horizontally-elongated through-holes 46 which are formed vertically. By forming the four through-holes 46, when viewed from the front side to the rear side, five bridges 47 may be provided vertically to connect left and right end portions of each shutter 45 in the left-right direction. FIGS. 12A to 12C schematically illustrate heights of the bridges 47 when each shutter 45 is raised and lowered. FIG. 12A, FIG. 12B, and FIG. 12C illustrate positions of the bridges 47 in the states illustrated in FIGS. 9, 10, and 11, respectively. In addition, arrows indicated in FIGS. 12A to 12C indicate the flow of the above-mentioned $N_2$ gas.

For the sake of convenience in description, the four shutters 45 will be referred to as shutters 45A to 45D. Lifting mechanisms 61 to 64 are provided on the front side of the housing 41. When viewed from the front side to the rear side, the lifting mechanisms 61 and 62 are provided on the left side of the housing 41, and the lifting mechanisms 63 and 64 are provided on the right side of the housing 41. The lifting mechanism 61 is connected to the shutter 45A and the lifting mechanism 62 to raise and lower the shutter 45A and the lifting mechanism 62. The lifting mechanism 62 is connected to the shutter 45B to raise and lower the shutter 45B. By being connected to the lifting mechanism 61 via the lifting mechanism 62, the shutter 45B is also raised and lowered by the lifting mechanism 61. The lifting mechanism 63 is connected to the shutter 45C and the lifting mechanism 64 to raise and lower the shutter 45C and the lifting mechanism 64. The lifting mechanism 64 is connected to the shutter 45D. Therefore, the shutters 45C and 45D are raised and lowered by the lifting mechanism 63. By being connected to the lifting mechanism 63 via the lifting mechanism 64, the shutter 45D is also raised and lowered by the lifting mechanism 63. With the above configuration, the shutters 45A to 45D may be raised and lowered relative to each other.

The lifting mechanisms 61 to 64 are constituted with, for example, cylinders, and are able to move the shutters 45 connected thereto between a raised position and a lowered position. As described above, the lifting mechanisms 61 and 63 also move the lifting mechanisms 62 and 64 together with the shutters 45. Movement distances of the shutters 45 and movement distances of the lifting mechanisms 61 and 64 are equal to each other. In addition, the distances between the raised positions and the lowered positions of the shutters 45 connected to the lifting mechanisms 61 to 64 are equal to each other. By the lifting mechanisms 61 to 64, a state in which the shutters 45 are located at the raised position will be referred to as an UP state, and a state in which the shutters 45 are located at the lowered position will be referred to as a DOWN state. In the buffer module 4 illustrated in FIG. 9 and FIG. 12A, all of the lifting mechanisms 61 to 64 are in the DOWN state. In this state, the four through-holes 46 in the shutters 45A to 45D overlap each other, and the slots 1, 2, 5, 6, 9, 10, 13, 14, 17, and 18 are open to the substrate transfer region R1 outside the housing 41, so that the substrates W may be transferred to these slots.

In addition, in the buffer module 4 illustrated in FIG. 10 and FIG. 12B, the lifting mechanisms 61 and 63 are in the UP state, and the lifting mechanisms 62 and 64 are in the DOWN state. In these states, the slots 3, 4, 7, 8, 11, 12, 15, and 16 are open to the substrate transfer region R1 outside the housing 41, so that the substrates W may be transferred to these slots. Therefore, each of the slots 1 to 18 is set to be in one of the states illustrated in FIGS. 9 and 10, so that the substrates W may be transferred via the respective slots. In addition, the state illustrated in FIG. 10 and FIG. 12B is equal to the state illustrated in FIG. 9 and FIG. 12A in that the four through-holes 46 of the shutters 45A to 45D overlap each other. However, the shutters 45A to 45D have different heights relative to the housing 41. In addition, in the buffer module 4 illustrated in FIG. 11 and FIG. 12C, the lifting mechanism 61 is in the DOWN state, and the lifting mechanisms 62 to 64 are in the UP state. In these states, since the heights of the bridges 47 of the shutters 45 deviate from each other, the storage space 42 is partitioned from the outside of the housing 41. That is, the slots 1 to 18 are closed with respect to the outside of the housing 41.

As described above, in the buffer module 4, each shutter 45 moves up and down such that only a limited number of slots are open to the substrate transfer region R1 outside the housing 41 when the substrates W are transferred. Therefore, the concentration of the $N_2$ gas in the housing 41 becomes relatively high, which more reliably suppresses the denaturation of the resist film. In order to store a desired number of substrates W, the number of buffer modules 4 corresponding to the number of substrates W is provided.

When transferring the substrates W from the transfer container C of the load port LP to the developing apparatus D2A, all the substrates W in the transfer container C are transferred to the buffer module 4 where they are kept in the $N_2$ gas atmosphere, and subsequently, are transferred to the processing block B2. Thereafter, the substrates W are sequentially transferred from the buffer module 4 to subsequent modules where the substrates W are subjected to exposure, PEB, and development. A timing at which the substrates W are taken out from the buffer module 4 is controlled according to a transfer situation of the substrates W in the module on the downstream side of the buffer module 4. That is, in a case where there is a stagnation in the processing in the module on the downstream side so that the transfer of the substrates W may stagnate, after such a situation is first resolved, the substrates W are taken out from the buffer module 4.

An operation of transferring the substrates W and processing on the substrates in the above-described substrate processing system 1A will be described, focusing on differences from the substrate processing system 1. First, the transfer container C is transferred to the load port LP of the apparatus D1 by the OHT 71, the resist film is formed on each substrate W in the transfer container C, and each substrate W is subjected to PAB. The transfer container C is transferred to the structure F1 of the developing apparatus D2A by the OHT, and is placed on the load port LP via the waiting shelf 52. Each substrate W discharged from the transfer container C is stored in the buffer module 4. The transfer container C from which all the substrates W have been discharged is transferred to the load port LP of the structure F2.

Then, the substrates W sequentially transferred from the buffer module 4 are transferred to the exposure machine EXP via the floor E1 of the processing block B2 and the interface block IFB where they are exposed. The substrates W after exposure are sequentially subjected to a first round of PEB, a first round of development by the developing solution-based module WDEV, and a second round of PEB on the floors E2 to E6 of the processing block B2. Thereafter, as described above, the substrates W are transferred to the processing block B2A of the structure F2 via the floor E3 and the substrate transfer block B3, and are subjected to a second round of development by the developing gas-based module GDEV. Thereafter, the substrates W are loaded into the transfer container C in the loading/unloading block B1A, and are unloaded from the substrate processing system 1A by the OHT 71.

Similarly to the apparatus D3 of the first embodiment, even in the developing apparatus D2A, the $N_2$ gas is supplied to the transfer container C in the waiting shelf 52 and each load port LP. In addition, the developing apparatus D2A is not provided with the shutter L4 provided in the apparatus D3, but may be provided with the shutter L4. In addition, in the above-mentioned configuration of the developing apparatus D2A, only one of the developing solution-based development and the gas-based development may be selectively performed. When only the developing solution-based development is performed, the substrates W may be returned to the transfer container C on the load port LP of the structure F1 without being transferred to the structure F2. In addition, although the first embodiment provides the configuration in which the heating by the heating module HML after development is not performed, the heating may be performed by a heating module provided near the substrate transfer regions R3 and R3A of the structures F1 and F2.

The buffer module 4 is not limited to being provided in the loading/unloading block B1, but may be provided in the processing block B2 or in the interface block IFB (that is, the block interposed between the processing block B2 and the exposure machine EXP). Specifically, for example, in the floor E1 of the processing block B2, the buffer module 4 may be provided at positions where the developing solution-based modules WDEV are provided in the floors E2 to E6, or in the tower T2 of the interface block IFB. In addition, one lot of substrates W after exposure and before PEB may be stored together, or one lot of substrates W after PEB and before development may be stored together. These PEB and developments may be the first and second rounds of PEBs and the first and second rounds of developments, respectively.

In the buffer module 4, the reaction of the resist on the substrates W accommodated therein may be promoted by forming an atmosphere based on the above-mentioned reaction-promoting gas or forming the depressurized atmosphere instead of forming an atmosphere of a gas such as the $N_2$ gas, which suppresses the reaction of the resist. In addition, as in the developing apparatus D2A, the buffer module 4 may be provided in the loading/unloading block B1 of the apparatus D1 to temporarily accommodate the substrates W which were processed in the apparatus D1 and to be transferred to the transfer container C, thereby suppressing or promoting the reaction.

Third Embodiment

Figure 13:
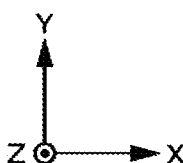
FIG. 13 is a schematic plan view illustrating a substrate processing system according to a third embodiment.

A substrate processing system 1B of a third embodiment of the present disclosure will be described with reference to FIG. 13. FIG. 13 is a plan view schematically illustrating the substrate processing system 1B, in which the substrate transfer region R2 of the processing block B2 is omitted and the floor E3 is illustrated as a representative of the floors E1 to E6. This holds true even in FIG. 14 and subsequent drawings.

The substrate processing system 1B of the third embodiment includes an apparatus D1B, an apparatus D3B, and an apparatus D2B arranged in the named order along the front-rear direction. A waiting shelf 52 and a delivery mechanism 72 are arranged on the left side of the apparatus D2B. Buffer modules 4 are provided in the loading/unloading block B1 of the apparatuses D1B to D3B. Unlike the second embodiment, the buffer modules 4 are provided not only on the rear side of the substrate transfer region R1, but also on the front side of the substrate transfer region R1. For the sake of convenience in illustration, the buffer modules 4 are illustrated within the substrate transfer region R1 rather than at positions adjacent to the substrate transfer region R1. The same applies to subsequent drawings.

Unlike the apparatus D1 of the substrate processing system 1, the apparatus D1B is connected to the exposure machine EXP via the interface block IFB. Unlike the apparatus D2, the apparatus D2B is not connected to the exposure machine EXP, and includes the developing solution-based module WDEV. In addition, the apparatus D3B differs from the apparatus D3 of the substrate processing system 1 in that it includes the developing gas-based module GDEV instead of the developing solution-based developing module DEV, and also includes the heating module PEB. Among the apparatuses D1B to D3B, only the apparatus D2B is provided with the delivery unit 50.

The OHT 71 transfers the transfer container C from the apparatus D1B to one of the apparatuses D2B and D3B where the substrates W are processed. Therefore, either the developing solution or the developing gas is supplied to the substrates W to perform a process. During the process, the substrates W are stored in the buffer modules 4 of the apparatuses D1B to D3B, and the reaction of MOR is suppressed or promoted.

Fourth Embodiment

Figure 14:
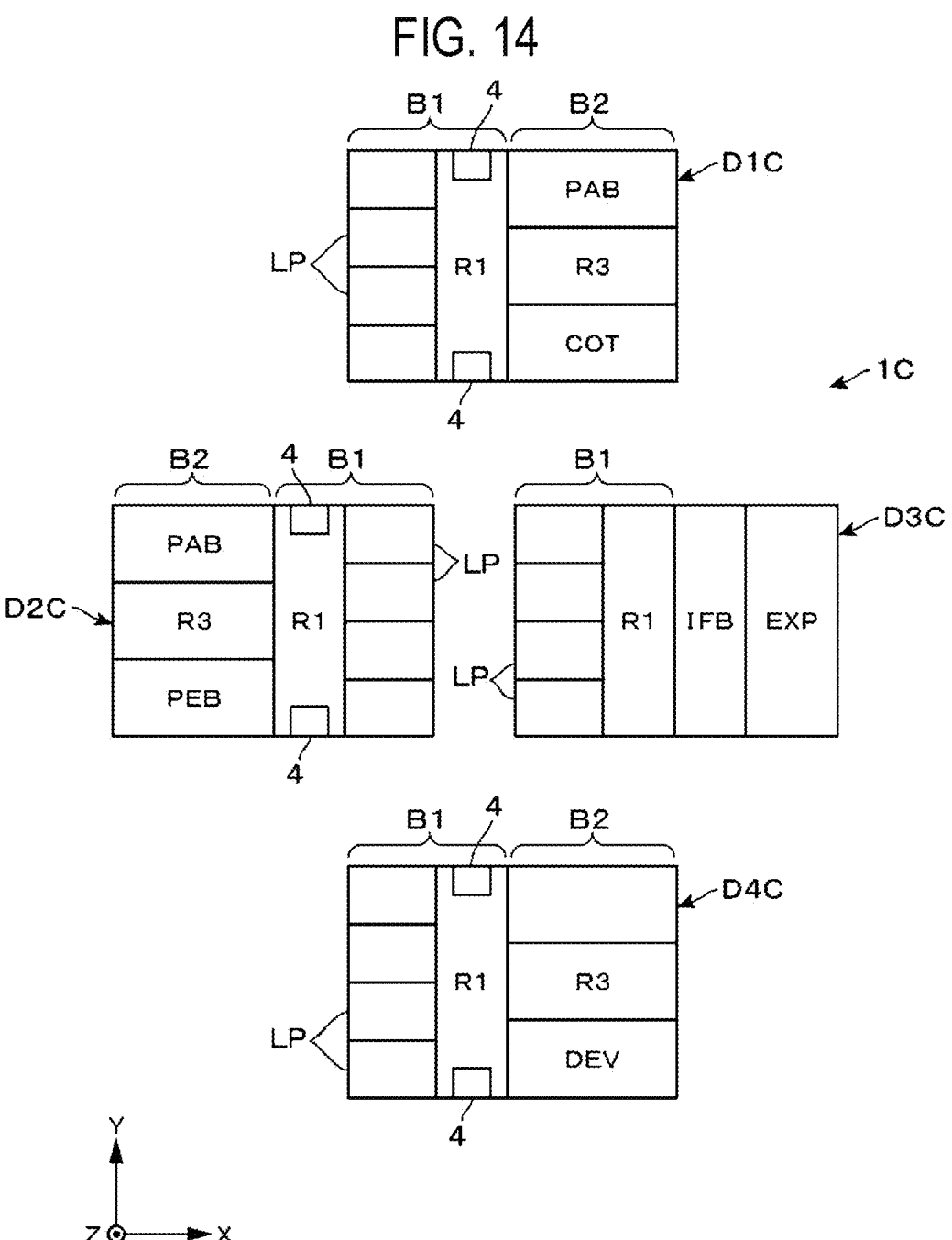
FIG. 14 is a schematic plan view illustrating a substrate processing system according to a fourth embodiment.

A substrate processing system 1C in a fourth embodiment of the present disclosure will be described with reference to FIG. 14. The substrate processing system 1C of the fourth embodiment includes four apparatuses D1C to D4C. The OHT 71 is omitted in FIG. 14. The same also applies to FIG. 15.

The apparatus D1C has the same configuration as the apparatus D1B of the third embodiment except that the exposure machine EXP is not connected to the apparatus D1C via the interface block IFB. In addition, the $N_2$ gas is supplied to the load ports LP and the buffer modules 4 to suppress the reaction.

The apparatus D2C differs from the apparatus D2B in that the heating module PAB is provided in addition to the heating module PEB configured to heat the substrates W after development, and no developing module DEV (WDEV) is provided. In addition, some of the plurality of load ports LP are supplied with the $N_2$ gas, and some others are supplied with the reaction-promoting gas. Further, some of the plurality of buffer modules 4 are supplied with the $N_2$ gas, and some others are supplied with the reaction-promoting gas.

The apparatus D3C has a configuration in which the exposure machine EXP is connected to the loading/unloading block B1 via the interface block IFB, and the load ports LP are supplied with the $N_2$ gas. The apparatus D4C has the same configuration as the apparatus D3B except that the delivery unit 50 and the second heating module PEB are not provided, and the reaction-promoting gas is supplied to the buffer modules 4.

The transfer container C is transferred by the OHT 71 in the order of the apparatus D1C, the apparatus D2C, the apparatus D3C, the apparatus D2C, and the apparatus D4C. When the substrates W are transferred to the apparatus D2C in a first round, the $N_2$ gas is supplied to the transfer container C on the load port LP, and the substrates W are stored in the buffer module 4 kept in a $N_2$ gas atmosphere. That is, the reaction of MOR is suppressed on the substrates W before exposure. Then, when the substrates W are transferred to the apparatus D2C in a second round, the reaction-promoting gas is supplied to the transfer container C on the load port LP, and the substrates W are stored in the buffer module 4 kept in a reaction-promoting gas atmosphere. That is, the reaction of MOR is promoted on the substrates W after exposure. In this way, the promotion and suppression of the reaction may be performed in one apparatus according to the conditions of processing the substrates W. Although the promotion and suppression of the reaction has been described to be performed in different load ports LP and different buffer modules 4, the promotion and suppression of the reaction may be switched in the same load port LP and/or the same buffer module 4. For example, a gas to be supplied may be switched. Alternatively, a case where both supply and exhaust of a reaction-suppressing gas are performed, and a case where only the exhaust of the reaction-suppressing gas is performed, may be switched.

Fifth Embodiment

Figure 15:
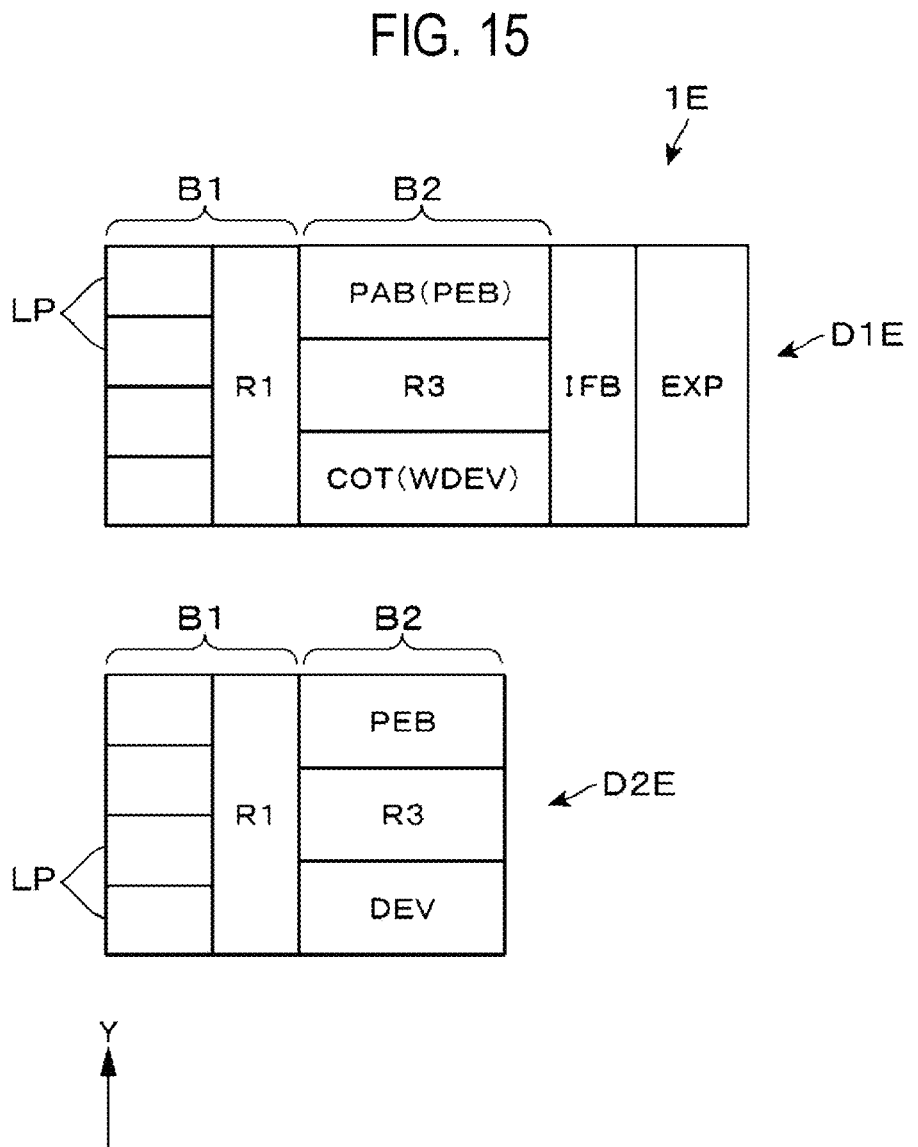
FIG. 15 is a schematic plan view illustrating a substrate processing system according to a fifth embodiment.

A substrate processing system 1E of a fifth embodiment of the present disclosure will be described with reference to FIG. 15. The substrate processing system 1E of the fifth embodiment is configured to include two apparatuses D1E and D2E. Each of PEB and development is performed twice as in the substrate processing system 1B illustrated in the second embodiment.

The apparatus D1E differs from the apparatus D1 of the first embodiment in that the processing block B2 is provided with the second heating module PEB and the developing solution-based module WDEV, and the processing block B2 is connected to the exposure machine EXP via the interface block IFB. In the processing block B2 of the apparatus D1E, the processing modules arranged in the floors E1 to E3 and the floors E4 to E6 are different from each other. Thus, in FIG. 15, the processing modules arranged in the floors E4 to E6 are indicated in parenthesis to distinguish from those arranged in the floors E1 to E3.

The coating module COT and the first heating module PAB are provided in the floors E1 to E3, and the developing solution-based module WDEV and the second heating module PEB are provided in the floors E4 to E6. As in the above-described examples, these modules are arranged at positions accessible by the substrate transfer mechanism 83 in the substrate transfer region R3.

The apparatus D2E differs from the apparatus D3 of the first embodiment in that the developing solution-based module WDEV and/or the developing gas-based module GDEV, and the second heating module PEB are provided. As in the above-described examples, these modules are arranged at positions accessible by the substrate transfer mechanism 83 in the substrate transfer region R3.

The substrates W, which have been subjected to the processes from the coating of the resist to the first round of PEB and development in the apparatus D1E, are stored in the transfer container C and are transferred to the apparatus D2E where they are subjected to the second round of PEB and development. For example, this system may be configured such that the load ports LP and buffer modules (not illustrated) of the apparatus D1E suppress the reaction of MOR, and the load ports LP and buffer modules (not illustrated) of the apparatus D2E promote the reaction of MOR.

Other Modifications

In the case of configuring a substrate processing system using a plurality of independent apparatuses as described above, allocation of processing modules to each apparatus is optional. An example of a configuration of a system other than the above-described systems will be described below. For example, a substrate processing system (denoted by reference numeral 1F) may be constituted with apparatuses in which the second heating module PEB is added to the apparatus D1C, the apparatus D3C, and the apparatus D4C illustrated in FIG. 14. Alternatively, for example, a substrate processing system (denoted by reference numeral 1G), which is a modification of the substrate processing system 1E illustrated in FIG. 15, may be constituted with an apparatus (denoted by D3E) in which the exposure machine EXP is connected to the apparatus D1C illustrated in FIG. 14 and the apparatus D2E illustrated in FIG. 15 via the interface block IFB, and the apparatus D2E. The apparatus D3E is an apparatus which performs the first round of PEB and development, and the apparatus D2E is an apparatus which performs the second round of PEB and development. Further, a substrate processing system (denoted by reference numeral 1H) according to a modification of the first embodiment may be constituted by providing the second heating module PEB, which was provided in the apparatus D2, in the apparatus D3. That is, the apparatus D3 may be configured to include, as the heating module, a module which performs heating after PEB and development, and the apparatus D2 may be configured to include no processing block B2 (may have the configuration of the apparatus D3C illustrated in FIG. 14).

In addition, whether or not to perform the suppression of the reaction or the promotion of the reaction may be appropriately set at various locations (the load ports LP and the buffer modules 4) where an ambient atmosphere of the substrates W may be regulated. Examples of the suppression of the reaction and the promotion of the reaction in the above-described substrate processing systems 1F and 1G will be described. In the substrate processing system 1F, the transfer container C is transferred in the order of the apparatus D1C, the apparatus D3C, and the apparatus D4C. The N₂ gas may be supplied to various locations of the apparatus D1C (the load ports LP and the buffer modules 4) through which the substrates W before exposure pass to suppress the reaction, the reaction-promoting gas may be supplied to various locations in the apparatuses D3C and D4C through which the substrates W after exposure pass to promote the reaction, and the reaction-promoting gas may be supplied to various locations in apparatus D3C in place of the N₂ gas. In the substrate processing system 1G, the transfer container C is transferred in the order of the apparatus D1C, the apparatus D3E, and the apparatus D2E. The N₂ gas may be supplied to various locations in the apparatus D1C and apparatus D3E through which the substrates W before exposure pass to suppress the reaction, and the reaction-promoting gas may be supplied to the apparatus D2 through which the substrates W after exposure pass.

It is thought that the influence of reaction when the resist is brought into contact with various components of the air after exposure is particularly large until PEB is performed. Therefore, the airflow by the air that has passed through the above-mentioned removal filter 33 may be formed in the apparatus through which the substrates W subjected to a sequence of exposure and PEB pass. In another apparatus, an airflow may be formed by air that has passed through a filter other than the removal filter 33, such as an ULPA (ultra-low penetration air) filter. Although the first embodiment illustrates an example in which the removal filter 33 is provided in the apparatus D3 which performs development, the removal filter 33 may not be provided in the apparatus D3 and may be provided only in the apparatus D2 which performs PEB after exposure. That is, the removal filters 33 may not be provided in all apparatuses through which the substrates subjected to a sequence of exposure and development pass.

In addition, the example in which the delivery unit 50 is provided in the apparatuses of each of the above-described systems, and the example in which the delivery unit 50 is not provided in the apparatuses of each of the above-described systems, have been described. However, whether or not to provide the delivery unit 50 may be appropriately determined according to situations of the loading/unloading of the transfer container C into/from the apparatuses. In addition, in the case where the delivery unit 50 is provided and the supply of the N₂ gas is performed in the waiting shelf 52, whether or not to perform the supply of the N₂ gas may be determined according to the concentration of the N₂ gas in the transfer container C. Specifically, a concentration detector may be provided in the exhaust flow path 18, and the valve 17 may be open at a certain timing to perform exhaust from the exhaust flow path 18 while the transfer container C is placed on the waiting shelf 52. The concentration detector transmits a detection signal to the controller 100. When it is determined that the concentration detected by the concentration detector is equal to or less than a reference value, the controller 100 performs a control to open the valves 14 and 17 to supply the N₂ gas into the transfer container C, so that the concentration of the N₂ gas is increased.

Although all the substrates W of the same lot have been described to be transferred to the buffer module 4, the present disclosure is not limited thereto. As described above, the buffer module 4 may be installed at any location in the apparatus. Whether or not to transfer the substrates W to the buffer module 4 may be appropriately determined in consideration of the transfer situation or the like within the apparatus.

Further, in the case where the buffer module 4 is provided in the processing block B2, the buffer module 4 may be provided at a location where the heating module is provided, in addition to a location where a liquid processing module is provided. In the case where the buffer module is provided in the interface block IFB, the buffer module may be provided at a location that is accessible by each transfer mechanism other than the tower T2, in addition to the tower T2. The number and arrangement layout of the transfer mechanisms are not limited to the example illustrated in the second embodiment, and may be set as appropriate. The substrates W are not limited to wafers, but may be other substrates such as substrates for manufacturing flat panel displays.

Sixth Embodiment

Figure 16:
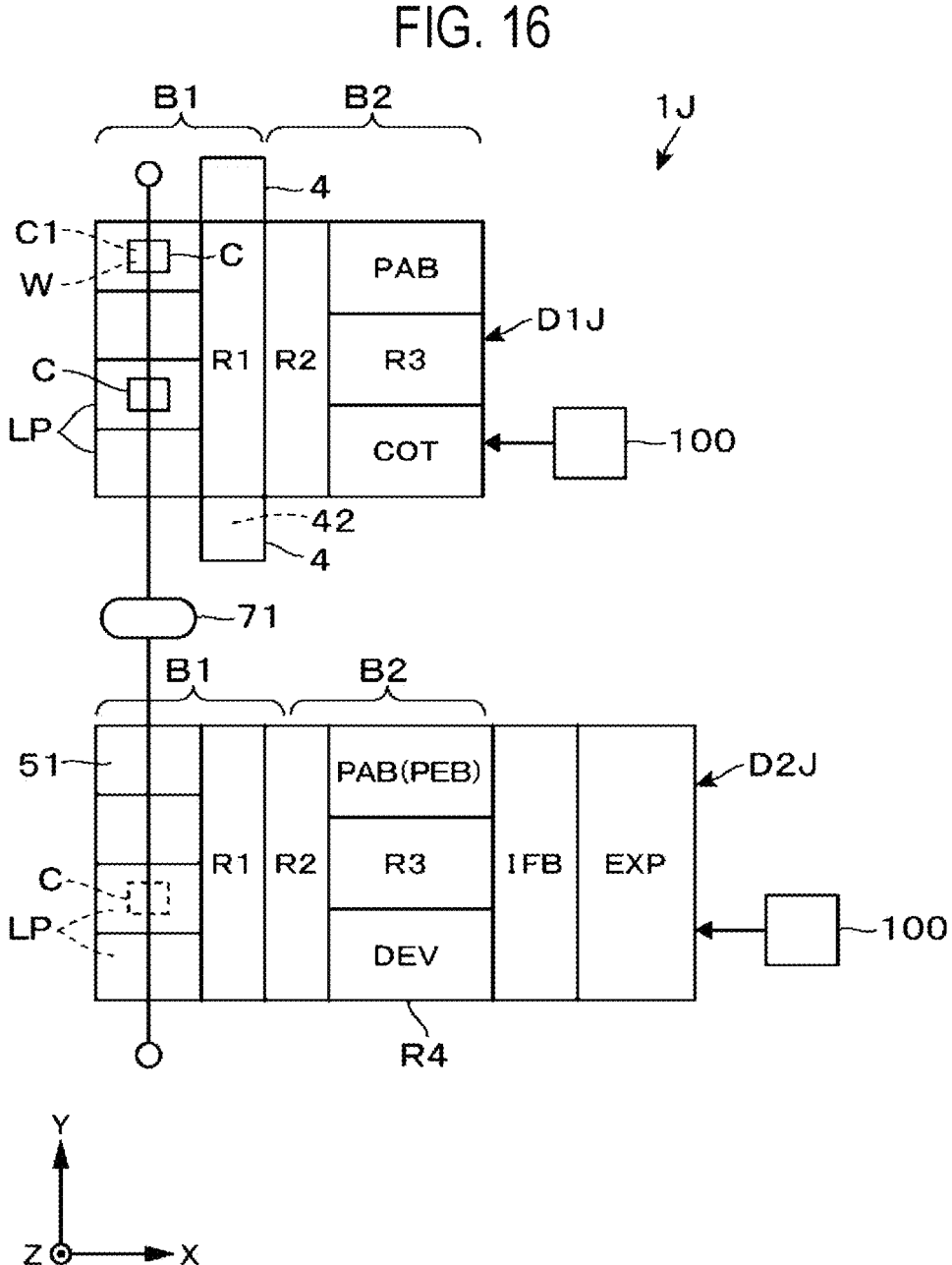
FIG. 16 is a schematic plan view illustrating a substrate processing system according to a sixth embodiment.

A substrate processing system 1J of a sixth embodiment of the present disclosure will be described with reference to FIG. 16. FIG. 16 is a schematic plan view illustrating the substrate processing system 1J of the sixth embodiment. This embodiment will be mainly described with a focus on differences from the first embodiment. Components similar to those in the first and second embodiments will be denoted by the same reference numerals, and descriptions thereof will be omitted. The substrate processing system 1J according to the sixth embodiment includes two apparatuses D1J and D2J.

The exposure machine EXP is connected to the processing block B2 of the apparatus D2J via the interface block IFB. The processing block B2 is provided with the second heating module PEB and the developing module DEV. The load ports LP of the apparatus D2J are supplied with the reaction-suppressing gas as described in the first embodiment.

In the loading/unloading block B1 of the apparatus D1J, the buffer modules 4 described in detail in the second embodiment are provided in the front-rear direction of the substrate transfer area R1. The processing block B2 of the apparatus D1J is provided with the coating module COT and the first heating module PAB, and is not connected to the exposure machine EXP via the interface block IFB. Each of the apparatuses D1J and D2J is provided with the airflow generator 3 equipped with the removal filter 33. The reaction-suppressing gas is supplied to the load ports LP and the buffer modules 4 of the apparatus D1J.

In the substrate processing system 1J, the substrates W are first transferred to the apparatus D1J by the transfer container C transferred by the OHT 71, are sequentially unloaded from the transfer container C in the load port LP of the apparatus D2J, and are transferred from the coating module COT to the first heating module PAB. In this operation, the substrates W are coated with the MOR resist and are subjected to PAB. The substrates W may be accommodated in the buffer module 4 before and after being transferred to the first heating module PAB. Then, the substrates W are stored in the transfer container C and transferred to the apparatus D2J by the OHT 71. The substrates W are sequentially transferred in the order of the exposure machine EXP, the second heating module PEB, and the development module DEV where the substrates W are subjected to a sequence of exposure, PEB, and development.

In addition, the first heating module PAB may be provided in the apparatus D2J. After the coating of the resist is performed in the apparatus D1J, the sequence of PAB to development may be performed in the apparatus D2J. As described above, the substrate processing system may be configured to include an apparatus which forms the resist film, and an apparatus which performs the development and is connected to the exposure machine EXP.

In the operation of transferring the substrates W in the substrate processing system 1J, as in the systems described thus far, the resist films on the substrates W may be appropriately exposed to an atmosphere of the reaction-suppressing gas in the transfer container C placed on the load port LP, the storage space 42 of the buffer module 4, or the substrate transfer areas R1 to R3. This makes it possible to suppress and regulate the reaction of the resist films on the substrates W and to regulate CDs to desired dimensions. It is also possible to make the CDs uniform among the substrates W.

The substrate processing system 1J is not limited to suppressing the reaction of MOR as described above, but may promote the reaction of MOR at various timings by using the methods described thus far to regulate the line width of the resist patterns. The reaction-promoting gas described in the first embodiment may be used to promote the reaction. The reaction may be performed by depressurizing the space in which the substrates W are accommodated and dehydrating the resist films in such a depressurized atmosphere to promote a condensation reaction. An acetic acid gas may be used as the reaction-promoting gas. The influence of the acetic acid gas on MOR changes according to a change in chemical properties of MOR in each process during patterning. The acetic acid gas supplied before PEB acts as the reaction-promoting gas.

In the above, the reaction-promoting gas has been described as being used to promote the denaturation of MOR. As described above, since the denaturation is caused by water and carbon dioxide, the denaturation of MOR will proceed even when air is supplied to MOR. A difference in a degree of progress of the denaturation may change the CDs of patterns of the resist film formed after development.

Figure 17:
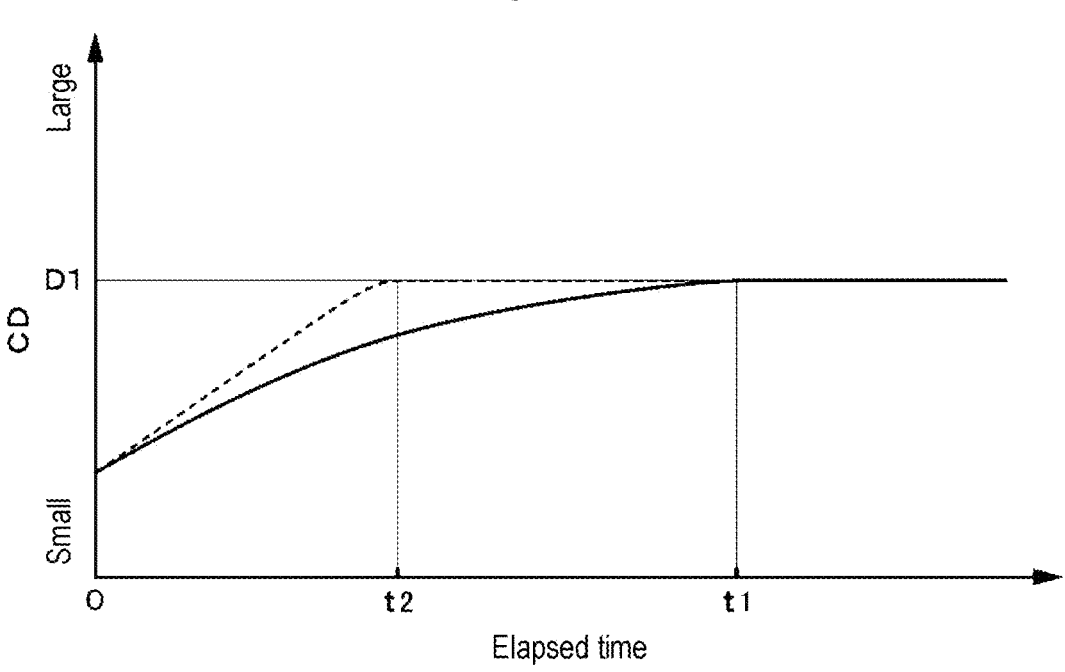
FIG. 17 is a graph illustrating a change in CD of a resist pattern over time.

FIG. 17 is a graph illustrating a relationship between a time period during which the substrate W is exposed to a gas atmosphere after the formation of the resist film and before development (the elapsed time from the formation of the resist film to the development) and the CD of the resist pattern formed by the development, which was obtained by an experiment. A solid line indicates the case where the substrate was exposed to the air as a gas, and a broken line indicates the case where the substrate was exposed to the reaction-promoting gas as a gas. In either case, as the elapsed time increases, the CD increases. However, as the elapsed time gradually changes, no change in CD was observed. That is, the reaction of the resist film is saturated. In such a saturated state, the change in CD is suppressed. In the drawing, for the elapsed time taken for the reaction to be saturated, the elapsed time when the air was used is indicated as t1, and the elapsed time when the reaction-promoting gas was used is indicated as t2. Here, the elapsed time t2 is longer than the elapsed time t1.

In the apparatus D1J of the substrate processing system 1J, the substrates W on each of which the resist film is formed are stored in the transfer container C and wait for a long time. During the waiting, the interior of the transfer container C is kept in the air atmosphere or an atmosphere in which the above-mentioned reaction is promoted (a reaction-promoting gas atmosphere or a depressurized atmosphere). After the waiting, the transfer container C is transferred to the apparatus D2J where the substrates W are processed. By allowing the substrates W to wait for such a long time after the formation of the resist film on the substrates W of the same lot before the development in which the denaturation of MOR may progress, the uniformity of the CDs of the resist patterns formed after the development between the substrates W of the same lot may be improved.

The waiting time for each substrate W is set to be longer than a required stay time (described in detail later) in processing modules which perform processes relating to patterning so that the required stay time is longer than the elapsed times t1 and t2 in the internal atmosphere of the transfer container C, which are indicated in the graph. As described above, the processing module may include the developing gas-based module GDEV, the developing solution-based module WDEV, each heating module, the coating module COT, or the like. For a waiting time longer than the required stay time in each of the processing modules, the substrates W of the same lot wait in the transfer container C whose interior is kept in the air atmosphere or a reaction-promoting atmosphere.

More specifically, the waiting time may be set to 10 minutes or more, and may be set to half a day or more. When allowing the substrates W to wait in this way, the delivery unit 50 and the waiting shelf 52, which are not illustrated in FIG. 16 but illustrated in, for example, FIG. 1 or the like, may be provided for the substrates W to wait in the transfer container C retreated to the stage 54.

The required stay time in the processing module refers to a time from when the substrates W are loaded into the processing module by the substrate transfer mechanism until when the substrates W are unloaded from the processing module by the substrate transfer mechanism, and includes a time required for processing and a time for a preliminary operation required for processing. Specifically, the preliminary operation includes moving the substrate W between a delivery position at which the substrate W is delivered from the substrate transfer mechanism to the processing module and a processing position at which the substrate is processed, or moving a member necessary for processing, such as a nozzle which supplies a processing liquid, before and after the start of the processing.

Further, when the transfer container C is kept in the air atmosphere, at the locations where the reaction-suppressing gas or the reaction-promoting gas is supplied into the transfer container C, such as the load ports LP and the waiting shelf 52, gas may be supplied from a gas supply mechanism including a gas source and a valve, instead of the reaction-suppressing gas and the reaction-promoting gas. In addition, since the substrate processing system 1J is installed in a clean room, the surrounding of the transfer container C is in the air atmosphere. Thus, the air may enter the transfer container C. Therefore, when the transfer container C is kept in the air atmosphere, the supply of the gas by the gas supply mechanism may be omitted.

The above-mentioned waiting time of the substrate W may refer to a time counted in a state in which the atmosphere (the air atmosphere or the reaction-promoting atmosphere) in which the denaturation of the resist film progress is formed within the transfer container C, the lid of the transfer container C is closed, and the container C is kept stationary. Therefore, when processed substrates W are loaded into the transfer container C with the lid opened, the time during which the processed substrates W are being loaded is not counted as the waiting time. Further, as described above, the interior of the transfer container C into which the substrates W are returned in the apparatus D1J may be kept in the air atmosphere. While the interior of the transfer container C is kept in the air atmosphere, the transfer container C may be transferred to the apparatus D2J. When the waiting time of the substrates W in the apparatus D1J is short, the denaturation of the resist films proceeds even during the transfer of the transfer container C. However, as described above, since the transfer container C is not stationary, the time during which the transfer container C is transferred is considered not to be included in the waiting time.

In the above, although the substrates W have been described to wait inside the transfer container C kept in the air atmosphere or the reaction-promoting atmosphere, the substrates W may wait inside the buffer module 4 kept in either the air atmosphere or the reaction-promoting atmosphere. In this case, the above-mentioned waiting time of the substrates W may refer to a time during which the air atmosphere or the reaction-promoting atmosphere is formed inside the buffer module 4, and the substrates W are placed in the slots. That is, when the substrates W are delivered to the buffer module 4 by the substrate transfer mechanism in the state where the air atmosphere or the reaction-promoting atmosphere is already formed inside the buffer module 4, a time from when the substrates W are placed on the supports 43 until when they are removed from the supports 43 may be counted as the waiting time.

In addition, the substrates W may wait in both the buffer module 4 and the transfer container C. The total time of the waiting time of the substrates W in the transfer container C and the waiting time of the substrates W in the buffer module 4 may be set to be longer than the above-mentioned required stay time in each processing module. Alternatively, the substrates may wait in each of a plurality of buffer modules 4, or the transfer container C may wait in each of the apparatuses D1J and D2J. That is, the substrates W may wait at a plurality of locations such that the waiting time is longer than the required stay time. Like the substrate processing system 1J described above, other systems may allow the substrates W to wait, thus making the CDs among the substrates W uniform.

In addition, as described above, the reaction of resist films may be saturated by leaving the transfer container C in which the substrates W are stored in the air atmosphere for a long time. In this case, the supply of the above-mentioned reaction-suppressing gas and reaction-promoting gas may be omitted during patterning. The stage L2 or the loading/unloading shelf 51 on which the transfer container C is placed in the air atmosphere until the waiting time elapses corresponds to the atmosphere regulator. As described above, when the transfer container C is placed on the waiting shelf 52, the waiting shelf 52 corresponds to the atmosphere regulator.

Modification

Figure 18A:
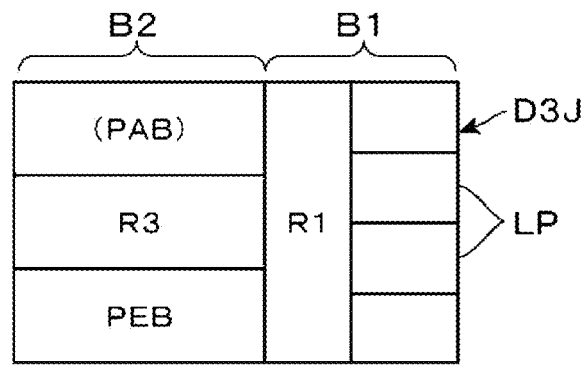
FIG. 18A is a schematic plan view illustrating an apparatus additionally provided in the substrate processing system.
Figure 18B:
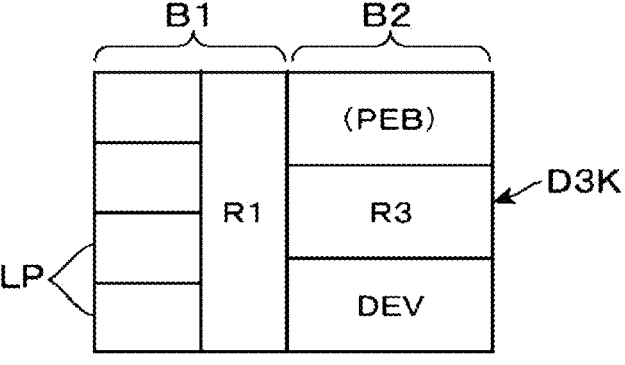
FIG. 18B is a schematic plan view illustrating an apparatus additionally provided in the substrate processing system.

The substrate processing system 1J of the present embodiment may include, for example, other apparatuses. FIGS. 18A and 18B are schematic plan views illustrating apparatuses D3J and D3K additionally provided in the substrate processing system 1J of the present embodiment. In FIGS. 18A and 18B, the illustration of the OHT 71 and the substrate transfer region R2 is omitted.

When the apparatus D3J illustrated in FIG. 18A is additionally provided in the substrate processing system 1J, the apparatus D3J is disposed at, for example, a position facing the left side of the load ports LP of the apparatus D2J. The processing block B2 of the apparatus D3J may include the heat treatment apparatus alone, may include the second heating module PEB, and may include the first heating module PAB in addition to the second heating module PEB.

During the processing on the substrates W, the substrates W are coated with the resist, are subjected to the first round of PEB and development in the apparatuses D1J and D2J, and subsequently, are subjected to the second round of PEB in the apparatus D3J and the second round of development in the apparatus D2J. The present disclosure is not limited to performing the sequence of PEB and development twice by the substrate processing system 1J. For example, the sequence of PEB and development may be performed once or three times or more. The apparatus D3J may perform not only the second round of PEB but also the first, third and subsequent rounds of PEBs. The apparatus D2J may perform the second and subsequent rounds of PEBs. Alternatively, the apparatus D1J may not perform PAB, but the apparatus D3J may perform PAB.

When an apparatus D3K illustrated in FIG. 18B is additionally provided in the substrate processing system 1J, the apparatus D3K is disposed at, for example, a position facing the front side of the apparatus D2J. The processing block B2 of the apparatus D3K may be provided with, for example, the developing module DEV, and may also be provided with the second heating module PEB in addition to the developing module DEV. The developing modules DEV disposed in the apparatus D3K and the above-mentioned apparatus D2J may be either the developing solution-based module or the developing gas-based module, or may include both the developing solution-based module and the developing gas-based module.

During the processing on the substrates W, the substrates W are coated with the resist, are subjected to the first round of PEB and development in the apparatuses D1J and D2J, and subsequently, are subjected to the second round of PEB and the second round of development in the apparatus D3K. The present disclosure is not limited to performing the sequence of PEB and development twice by the substrate processing system 1J. For example, the sequence of PEB and development may be performed once or three times or more. The apparatus D3K may perform not only the second round of PEB but also the first, third and subsequent rounds of PEBs. The apparatus D2J may perform the second and subsequent rounds of PEBs.

In addition, both the apparatuses D3J and D3K may be additionally provided in the substrate processing system 1J. The buffer module 4 may also be provided in the apparatuses D2J, D3J, and D3K as in the apparatus D1J. The apparatuses D3J and D3K additionally provided as above are capable of making the CDs uniform between the substrates W by appropriately suppressing, promoting, or saturating the reaction of the resist film using the same operations as in the above-described apparatuses D1J and D2J.

According to the present disclosure, it is possible to suppress a variation in patterns formed on a plurality of substrates, which are subjected to processes such as formation of a metal-containing resist film, exposure, development and the like.

It should be noted that the embodiments disclosed herein are exemplary in all respects and are not restrictive. The above-described embodiments may be omitted, replaced, modified or combined with each other in various forms without departing from the scope and spirit of the appended claims.

What is claimed is:

1. A developing apparatus that performs a development process on a metal-containing resist film on a surface of a substrate which has been subjected to an exposure process, comprising:
    a developing module;
    a load port including a stage on which a transfer container is placed; and
    an inert gas supply path connected to an interior of the transfer container via the load port, wherein an inert gas flows through the inert gas supply path, wherein the developing apparatus is provided independent of an exposure apparatus,
    wherein a mounting hole is formed on a bottom wall of the transfer container,
    wherein the stage is movable between an unloading position and a loading position,
    wherein a relay connector is formed on the stage so as to penetrate the stage, and
    wherein, when the stage is at the loading position, the relay connector is connected between the mounting hole and the inert gas supply path.

2. The developing apparatus of claim 1, further comprising: an exhaust path connected to the interior of the transfer container via the load port.

3. The developing apparatus of claim 1, further comprising: a heat treatment apparatus that performs a heat treatment on the metal-containing resist film before the development process.

4. The developing apparatus of claim 1, wherein the inert gas is supplied to the interior of the transfer container, and the inert gas in the transfer container suppresses a reaction of the metal-containing resist film.

5. The developing apparatus of claim 1, wherein the developing apparatus is provided independently of a resist film forming apparatus that forms the metal-containing resist film.

6. The developing apparatus of claim 1, further comprising: a shutter that opens and closes the load port in a state in which a lid of the transfer container is open.

7. A developing apparatus that performs a development process on a metal-containing resist film on a surface of a substrate which has been subjected to an exposure process, comprising:
    a developing module;
    a load port including a stage on which a transfer container is placed; and
    an inert gas supply path connected to an interior of the transfer container via the load port, wherein an inert gas flows through the inert gas supply path,
    wherein the developing apparatus is provided independent of an exposure apparatus, and
    wherein the developing module is a developing gas-based module.

8. The developing apparatus of claim 7, wherein the developing apparatus includes a buffer module having a depressurized atmosphere.

9. The developing apparatus of claim 7, wherein the developing apparatus further includes a developing solution-based module.

* * * * *